(12) United States Patent
Mori

(10) Patent No.: US 8,044,689 B2
(45) Date of Patent: Oct. 25, 2011

(54) SEMICONDUCTOR CIRCUIT

(75) Inventor: Kazuhiro Mori, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 104 days.

(21) Appl. No.: 12/081,087

(22) Filed: Apr. 10, 2008

(65) Prior Publication Data

US 2008/0258803 A1 Oct. 23, 2008

(30) Foreign Application Priority Data

Apr. 23, 2007 (JP) ................. 2007-113070

(51) Int. Cl.
*H03B 1/00* (2006.01)
(52) U.S. Cl. .................. 327/108; 327/112; 327/391
(58) Field of Classification Search .................. 327/108, 327/109, 111, 112, 170, 389, 391; 326/26, 326/27, 82, 83
See application file for complete search history.

(56) References Cited

U.S. PATENT DOCUMENTS

| | | | | |
|---|---|---|---|---|
| 4,622,480 A | * | 11/1986 | Uchimura et al. | 327/337 |
| 5,708,386 A | * | 1/1998 | Chow | 327/380 |
| 5,864,254 A | * | 1/1999 | Tashiro | 327/319 |
| 5,923,212 A | * | 7/1999 | Womack | 327/541 |
| 6,522,511 B1 | * | 2/2003 | John et al. | 361/56 |
| 6,617,906 B1 | * | 9/2003 | Hastings | 327/321 |
| 6,897,702 B2 | * | 5/2005 | Khieu et al. | 327/313 |
| 7,102,414 B2 | * | 9/2006 | Lin | 327/419 |

FOREIGN PATENT DOCUMENTS

JP 2006-245828 9/2006

OTHER PUBLICATIONS

Weste et al., Principles of CMOS VLSI Design: A Systems Perspective, 1993, Addison-Wesley Publishing Company, $2^{nd}$ edition, pp. 51-53.*

* cited by examiner

*Primary Examiner* — Long Nguyen

(74) *Attorney, Agent, or Firm* — McGinn IP Law Group, PLLC

(57) ABSTRACT

A pseudo differential circuit is a circuit system taking the advantages of both a CMOS circuit and a differential circuit. However, when process variability and the like are taken into account, a cross point of positive and negative outputs is not constant, thereby increasing a variation in duty of an output waveform. A semiconductor circuit according to the present invention includes: a first transistor being of a first conductivity type, coupled between a first power supply and an output terminal, and applied with an input signal; a second transistor being of a second conductivity type and coupled between a second power supply and the output terminal; a third transistor being of the second conductivity type and coupled between the first power supply and the output terminal; and a fourth transistor being of the first conductivity type and coupled between the second power supply and the output terminal.

26 Claims, 19 Drawing Sheets

FIG. 2

| | TRANSISTOR CAPABILITIES CAUSED BY PROCESS VARIABILITY | | |
|---|---|---|---|
| | SMALL | MIDDLE | LARGE |
| $\beta_N$ | 200e-6 | 210e-6 | 220e-6 |
| $\beta_P$ | 80e-6 | 90e-6 | 100e-60 |
| $Vth_N$ | 0.5 [V] | 0.4 [V] | 0.3 [V] |
| $Vth_P$ | 0.6 [V] | 0.5 [V] | 0.4 [V] |

INPUT VOLTAGE

OUTPUT VOLTAGE

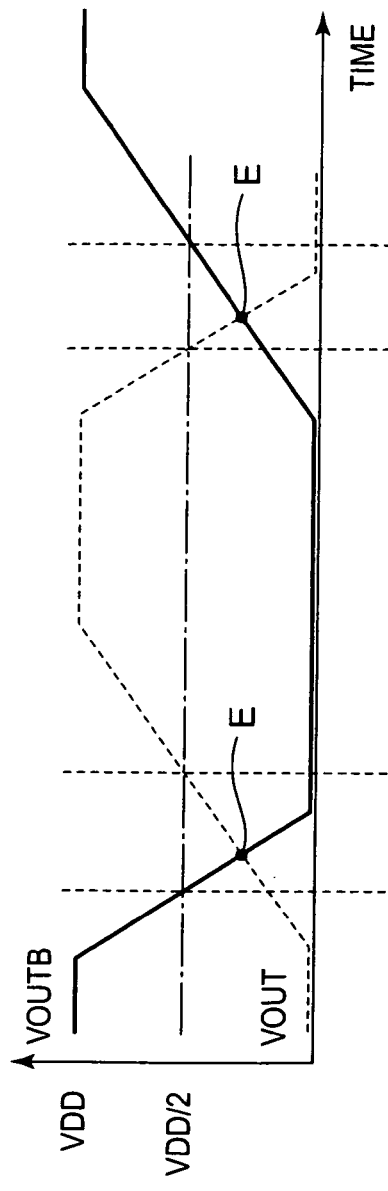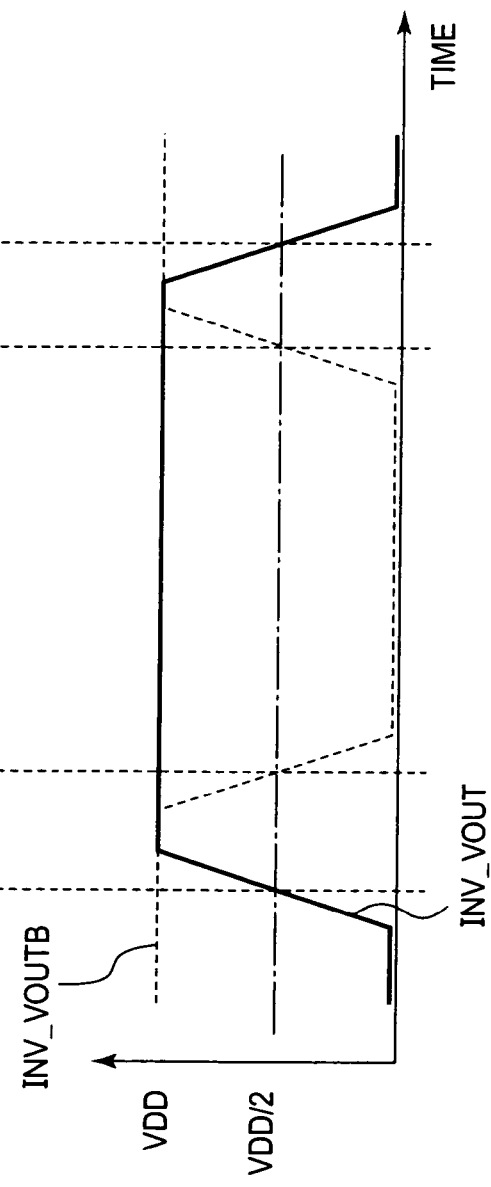

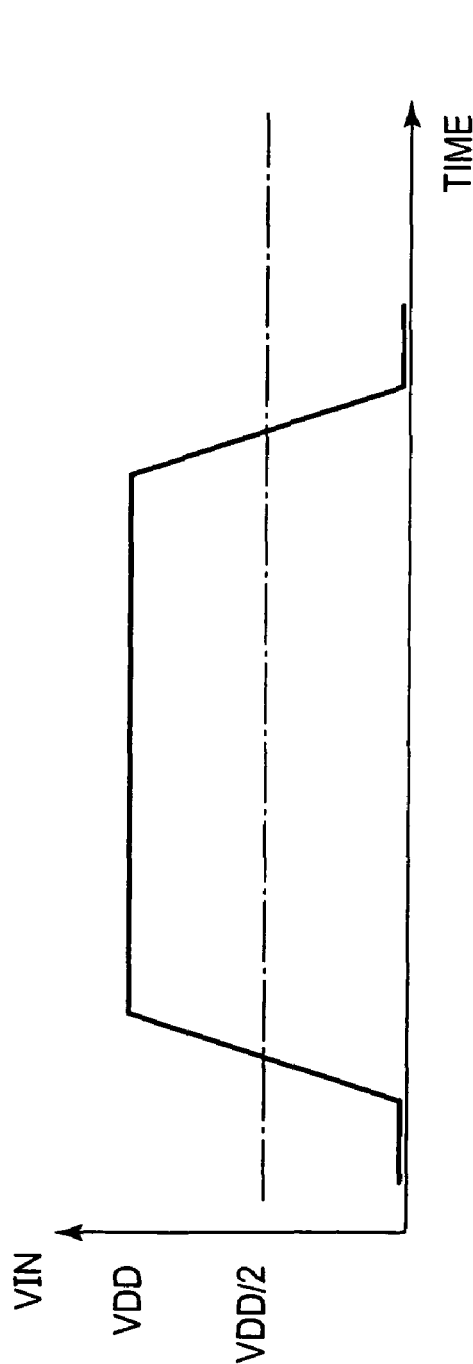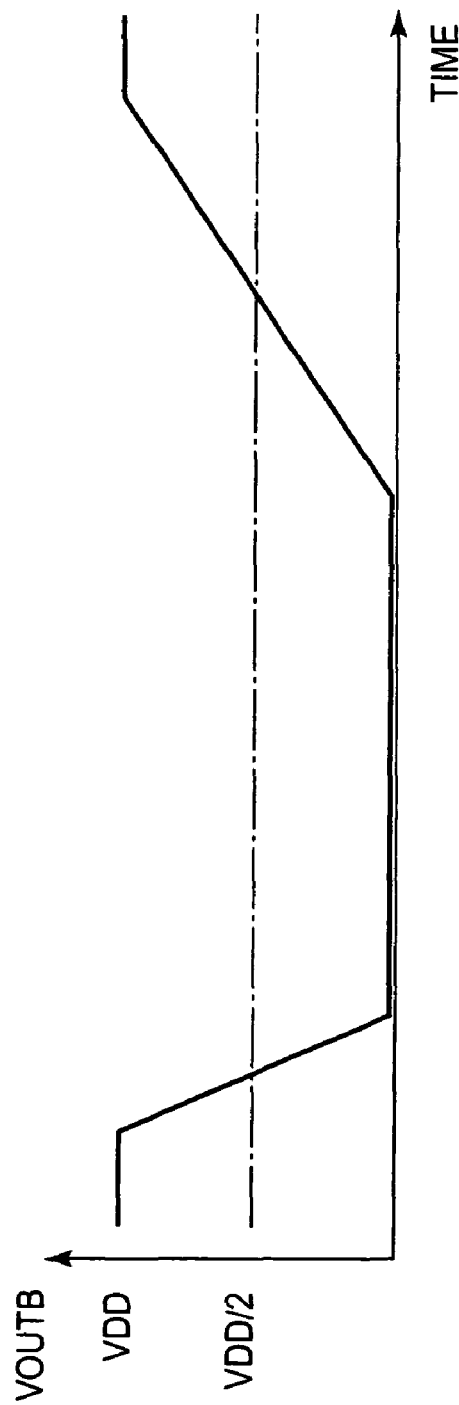

US 8,044,689 B2

SEMICONDUCTOR CIRCUIT

BACKGROUND OF THE INVENTION

1. Field of the Invention

The present invention relates to an output buffer, and more particularly, to an output buffer for compensating a deviation caused by process variability.

2. Description of the Related Art

An output buffer including a CMOS circuit is used for a semiconductor circuit. FIG. 21 is a circuit diagram showing a generally-known output buffer. The output buffer shown in FIG. 21 is a buffer for inverting and out putting a signal applied to an input terminal. When an intermediate potential VDD/2 between a power supply potential (VDD) and a ground potential (VSS) is input to the input terminal of the output buffer, it is preferable to output the potential VDD/2 from an output terminal thereof. A technology of stabilizing the potential at the output stage is described in, for example, JP 2006-245828 A.

However, in an output buffer circuit 11 where a CMOS circuit is included as shown in FIG. 21, when a PMOS transistor and an NMOS transistor are formed, there exists process variability. As a result, when the characteristics of the respective transistors deviates from design values, an output voltage may deviate from VDD/2 even if the VDD/2 is input as an input voltage. Therefore, there is the case where the output buffer circuit 11 does not act as an output buffer which performs an accurate operation.

The output buffer circuit 11 according to the conventional technology includes an input terminal 11 to which an input signal IN is input, an n-type MOS transistor MN1 for generating an inverted logic of the input signal IN, a p-type MOS transistor MP1 serving as a load for the MOS transistor MN1, and an output terminal 2 from which an output signal OUTB is output.

The sizes of the MOS transistors MP1 and MN1 of the circuit as shown in FIG. 21 are generally determined such that, as an operating point (point at which the middle of the amplitude of a signal output to the output terminal 2 relative to a voltage input to the input terminal 1 is equal to VDD/2), a voltage VOUTB output to the output terminal 2 becomes VDD/2 when a voltage VIN input to the input terminal 1 is VDD/2.

However, a semiconductor circuit manufacturing process size has been reduced in recent years, so variations in current gain ($\beta$) value and threshold voltage (Vth) value in each of the n-type MOS transistor and the p-type MOS transistor are caused by the process variability as described above. Therefore, even when the semiconductor circuit is formed based on values obtained by theoretical calculation, there is a difference from expected transistor capability, so a predetermined circuit output is not obtained.

Here, a variation in transistor capability being caused by the variability of the manufacturing process (process variability) is expressed as "n-type MOS transistor capability/p-type MOS transistor capability." For example, when the process variability is "large/small," a current gain $\beta N$ and a threshold voltage VthN of the n-type MOS transistor and a current gain $\beta P$ and a threshold voltage VthP of the p-type MOS transistor deviate from expected values. Therefore, the operating point of the voltage VOUTB decreases in the case where the voltage VIN is VDD/2. The operating waveforms at this time are shown in FIGS. 22A and 22B. On the other hand, even when the process variability is "small/large," the current gain PN and the threshold voltage VthN of the n-type MOS transistor and the current gain $\beta P$ and the threshold voltage VthP of the p-type MOS transistor deviate from the expected values. Therefore, the operating point of the voltage VOUTB increases in the case where the voltage VIN is VDD/2. The operating waveforms at this time are shown in FIGS. 23A and 23B.

As described above, there is the case where the theoretical output corresponding to the input is not obtained in the conventional output buffer having the CMOS structure because of, for example, the process variability.

SUMMARY

In one embodiment, a semiconductor circuit includes: a buffer configured to allow a first current to flow to a node, wherein the buffer comprises a first plurality of transistors configured to allow the first current to leak in response to product variability in transistor characteristics at an operating point; and a compensating circuit configured to enable a second current to flow to the node to compensate for the first current, wherein the compensating circuit comprises a second plurality of transistors generating the second current in response to product variability in transistor characteristics at the operating point.

According to the semiconductor circuit of the above embodiments, an operating current deviation between the first transistor and the second transistor being caused by the variability of a manufacturing process is corrected by operating currents of the third transistor and the fourth transistor, so an operating point deviation of an output signal can be compensated.

According to the semiconductor circuit of the above embodiments, a deviation of an output from an input being caused by process variability of the semiconductor circuit can be compensated.

BRIEF DESCRIPTION OF THE DRAWINGS

In the accompanying drawings:

FIG. 2 shows examples of variations in respective MOS transistor capabilities which are caused by the variability of manufacturing process;

FIGS. 14A and 14B show examples of operating waveforms of the circuit of FIG. 13;

FIGS. 22A and 22B show examples of operating waveforms in the case where process variability on the buffer circuit according to the conventional technique corresponds to the "large/small" condition.

DETAILED DESCRIPTION OF THE PREFERRED EMBODIMENTS

Embodiment 1 of the Present Invention

Hereinafter, a specific example of a semiconductor circuit according to Embodiment 1 of the present invention will be described in detail with reference to the attached drawings. In Embodiment 1, the present invention is applied to a buffer circuit (one side of pseudo differential buffer circuit).

Figure 1:
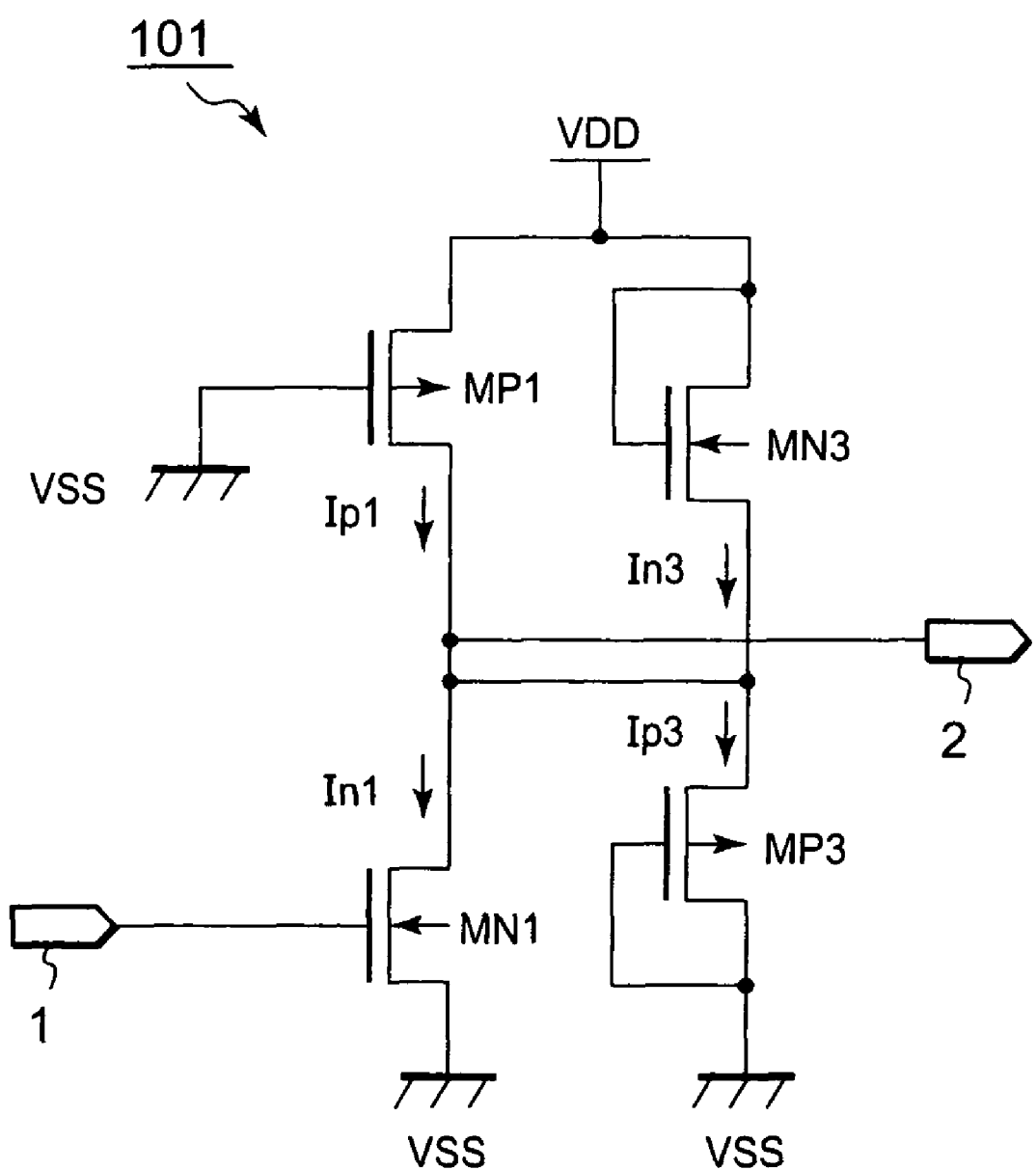
FIG. 1 shows an example of a structure of a buffer circuit according to Embodiment 1 of the present invention.
Figure 21:
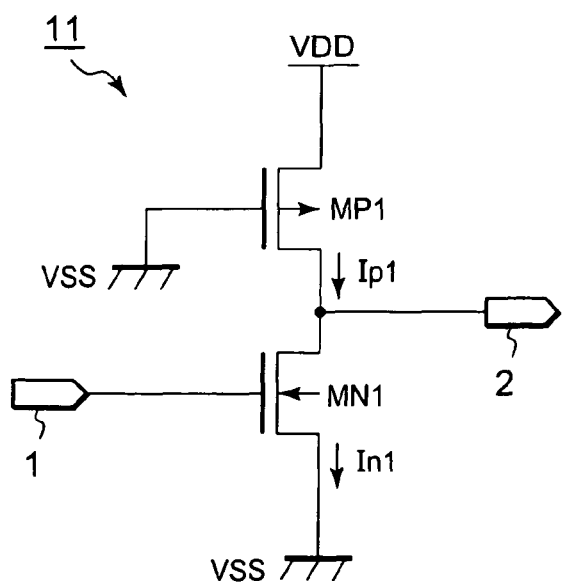
FIG. 21 shows an example of a structure of the buffer circuit according to the conventional technique.
Figure 23A:
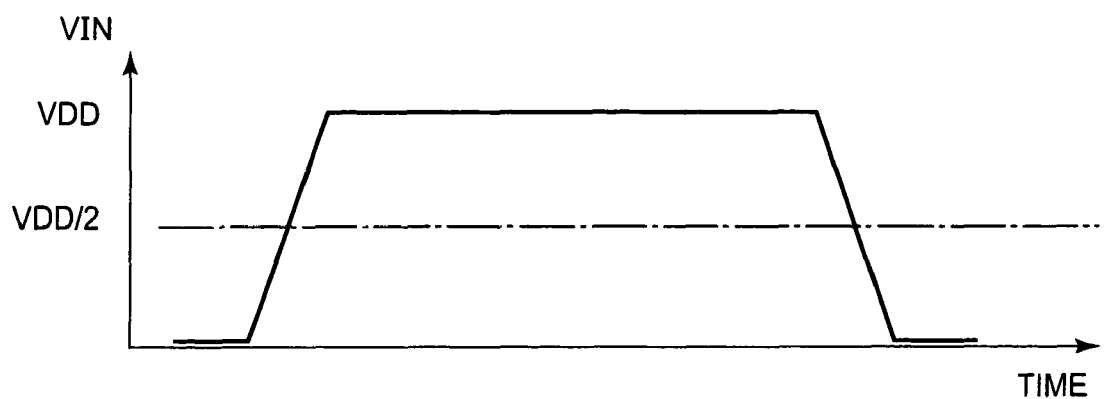
FIGS. 23A and 23B show examples of operating waveforms in the case where the process variability on the buffer circuit according to the conventional technique corresponds to the "small/large" condition.
Figure 23B:
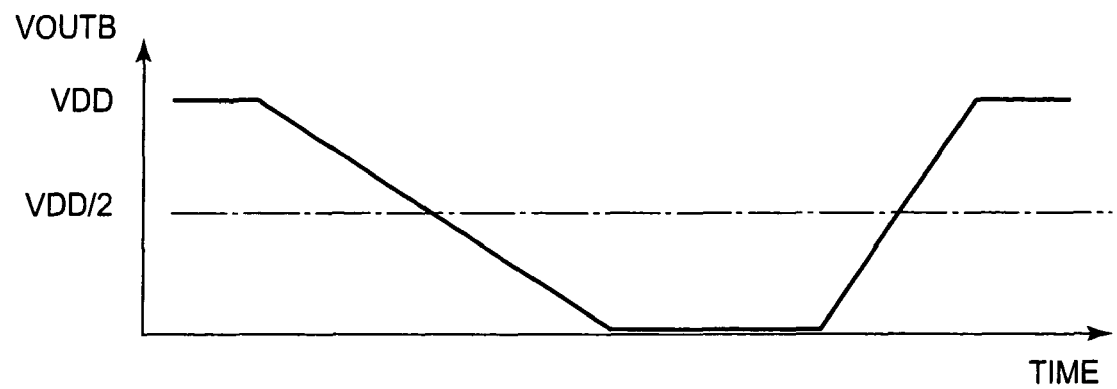

FIG. 1 shows an example of a structure of a buffer circuit according to Embodiment 1 of the present invention. Of reference symbols shown in FIG. 1, elements expressed by the same reference symbols as those shown in FIG. 21 are identical or similar to elements shown in FIG. 21. Embodiment 1 is different from the conventional technique in that the buffer circuit further includes an n-type MOS transistor MN3 and a p-type MOS transistor MP3.

A buffer circuit 101 includes an input terminal 1 to which an input signal IN is input, an n-type MOS transistor MN1 for generating an inverted logic of the input signal, a p-type MOS transistor MP1 serving as a load for the MOS transistor MN1, and an output terminal 2 from which an output signal OUTB being the inverted logic of the input signal is output. The buffer circuit 101 further includes the n-type MOS transistor MN3 and the p-type MOS transistor MP3 which are used to compensate for a variation in rise time of the output signal OUTB.

The MOS transistor MN1 includes a gate coupled to the input terminal 1, a drain coupled to the output terminal 2, and a source coupled to a low-potential side power supply potential VSS. The MOS transistor MP1 includes a gate coupled to the low-potential side power supply potential VSS, a drain coupled to the output terminal 2, and a source coupled to a high-potential side power supply potential VDD. The MOS transistor MN3 includes a source coupled to the output terminal 2 and a drain and a gate which are coupled to the high-potential side power supply potential VDD. The MOS transistor MP3 includes a source coupled to the output terminal 2, and a drain and a gate which are coupled to the low-potential side power supply potential VSS. Assume that a voltage input to the input terminal 1 is expressed by VIN and a voltage output to the output terminal 2 is expressed by VOUTB.

Hereinafter, a method of determining transistor sizes of the semiconductor circuit according to Embodiment 1 of the present invention will be described. Assume that a gate width of an n-type MOS transistor is expressed by WMN1, a gate width of a p-type MOS transistor is expressed by WMP1, a gate length of the n-type MOS transistor is expressed by LMN1, a gate length of the p-type MOS transistor is expressed by LMP1, a product of a carrier mobility and a gate oxide film capacitance in the n-type MOS transistor is expressed by $\beta$N, a product of a carrier mobility and a gate oxide film capacitance in the p-type MOS transistor is expressed by $\beta$P, a gate-source voltage of the n-type MOS transistor is expressed by VGSMN1, a gate-source voltage of the p-type MOS transistor is expressed by VGSMP1, a threshold voltage of the n-type MOS transistor is expressed by VthN, and a threshold voltage of the p-type MOS transistor is expressed by VthP. In this case, a current Ip1 flowing through the MOS transistor MP1 and a current In1 flowing through the MOS transistor MN1 are obtained by the following expressions.

$$In1=(\beta N/2)\times(WMN1/LMN1)\times(VGSMN1-VthN)^2 \quad \text{Expression (1)}$$

$$Ip1=(\beta P/2)\times(WMP1/LMP1)\times(VGSMP1-VthP)^2 \quad \text{Expression (2)}$$

In order to adjust VOUTB to VDD/2 when VIN is equal to VDD/2, the sizes of the MOS transistors MN1 and MP1 are preferably determined such that In1 is equal to Ip1 in the condition (VIN=VDD/2 and VOUTB=VDD/2).

Because VIN is equal to VDD/2, VGSMN1 is equal to VDD/2. The gate of the MOS transistor MP1 is coupled to the low-potential side power supply potential VSS, so VGSMP1 is equal to VDD.

Therefore, when the condition of "VGSMN1=VDD/2" and "VGSMP1=VDD" is added to Expressions (1) and (2), transistor size ratios (WMN1/LMN1 and WMP1/LMP1) can be determined.

The semiconductor circuit according to Embodiment 1 of the present invention further includes the n-type-MOS transistor MN3 and the p-type MOS transistor MP3. Therefore, transistor sizes are determined using the following expressions for a current In3 flowing through the MOS transistor MN3 and a current Ip3 flowing through the MOS transistor MP3.

$$In3=(\beta N/2)\times(WMN3/LMN3)\times(VGSMN3-VthN)^2 \quad \text{Expression (3)}$$

$$Ip3=(\beta P/2)\times(WMP3/LMP3)\times(VGSMP3-VthP)^2 \quad \text{Expression (4)}$$

In order to adjust VOUTB to VDD/2 when VIN is equal to VDD/2, in the case of the condition (VIN=VDD/2 and VOUTB=VDD/2), it is preferable to determine the sizes of the MOS transistors MN1 and MP1 such that In1 is equal to Ip1 and to determine the sizes of the MOS transistors MN3 and MP3 such that In3 is equal to Ip3.

Because VOUTB is equal to VDD/2 and the gate of the MOS transistor MN3 is coupled to the high-potential side power supply potential VDD, VGSMN3 is equal to VDD/2. The gate of the MOS transistor MP3 is coupled to the low-potential side power supply potential VSS, so VGSMP3 is equal to VDD/2. Therefore, when the condition of "VGSMN3=VDD/2" and "VGSMP3=VDD/2" is added to Expressions (3) and (4), size ratios WMN3/LMN3 and WMP3/LMP3 can be determined.

When the transistors satisfying the size ratios are formed, the buffer circuit 101 is capable of outputting VDD/2 as VOUTB when VIN is equal to VDD/2.

As described in the conventional technique, the semiconductor circuit manufacturing process becomes finer, so variations occur in β value and threshold voltage value in each of the n-type MOS transistor and the p-type MOS transistor. FIG. 2 is a table showing examples of variations in values of βN, βP, VthN, and VthP which are caused by the variability of a transistor manufacturing process. Note that a negative sign of VthP is omitted. Hereinafter, transistor sizes, a voltage at an operating point, and the like are specifically obtained based on the values shown in the table.

Specific numeral values of WMP1 and WMP3 are obtained in the case where the variability of the manufacturing process on each of the n-type MOS transistor and the p-type MOS transistor corresponds to a "middle" condition (that is, a condition in which there is no variability of the manufacturing process, hereinafter referred to as TYP condition) in the table shown in FIG. 2 are obtained. Each of LMN1, LMP1, LMN3, and LMP3 is set to 0.2 μm, WMN1 is set to 10 μm, WMN3 is set to 3.5 μm, and VDD is set to 1.5 V. The set values are substituted into Expressions (1), (2), (3), and (4). In this way, WMP1 (=2.9 μm) and WMP3 (=16.0 μm) can be obtained.

Because the transistor size values as described above are obtained, when VIN is equal to VDD/2 in the TYP condition, VOUTB becomes equal to VDD/2. Therefore, an operating point of the output signal OUTB can be set to VDD/2 corresponding to the middle operating point. The transistor sizes of the semiconductor circuit are determined for a normal manufacturing process based on the TYP condition.

Next, the case where the process variability on the n-type MOS transistor and the p-type MOS transistor is taken into account is considered. In general, the types of combined variability of the "n-type MOS transistor capability/p-type MOS transistor capability" include five types, "large/large", "middle/middle", "small/small", "large/small", and "small/large". In this case, the types of "large/small" and "small/large" are considered. This is because the directions of variability of the n-type MOS transistor capability and the p-type MOS transistor capability are equal to each other in the types of "large/small" and "small/large", thereby making the same behavior as that in the TYP condition ("middle/middle").

The case where the type of the process variability on the n-type MOS transistor and the p-type MOS transistor is "large/small" is considered. In this case, as is apparent from the table shown in FIG. 2, βN, βP, VthN, and VthP are 220e-6, 80e-6, 0.3 V, and 0.6 V, respectively. When In1 is calculated based on the transistor sizes (each of LMN1, LMP1, LMN3, and LMP3 is 0.2 μm, WMN1 is 10 μm, WMP1 is 2.9 μm, WMN3 is 3.5 μm, and WMP3 is 16.0 μm) prepared under the TYP condition in the case of VGSMN1=VIN=VDD/2=0.75 V, 1.1137 mA is obtained as In1 from Expression (1). Similarly, when Ip1 is calculated using Expression (2) in the case of VGSMP1=VDD=1.5 V, 0.47 mA is obtained as Ip1. When In3 is calculated using Expression (3) in the case of VGSMN3=VDD/2=0.75 V, 0.389 mA is obtained as In3. When Ip3 is calculated using Expression (4) in the case of VGSMP3=VDD/2=0.75 V, 0.072 mA is obtained as Ip3.

As is apparent from FIG. 1, because of circuit coupling in Embodiment 1 of the present invention, a difference current between Ip1 and In1, that is, 0.6437 mA (=1.1137 mA−0.47 mA) is adjusted by a difference current between Ip3 and In3, that is, 0.317 mA (=0.389 mA−0.072 mA). Therefore, substantial Ip1 is corrected up to 0.787 mA (=0.47 mA+0.317 mA). Thus, when VGSMN1 (=VIN) in the case of In1=Ip1=0.787 mA is calculated using Expression (1), 0.678 V is obtained as VGSMN1 (=VIN).

In order to compare the present invention with the conventional technique, VGSMN1 (=VIN) of the buffer circuit 11 according to the conventional technique as shown in FIG. 21 in the case where the type of the process variability is "large/small" is calculated. In the case of the transistor sizes (each of LMN1 and LMP1 is 0.2 μm, WMN1 is 10 μm, and WMP1 is 2.9 μm), 0.59 V is obtained as VGSMN1 using Expressions (1) and (2). Because VGSMN1 is equal to VIN, VIN in the case where the type of the process variability is "large/small" is reduced by 0.16 V from 0.75 V, being VIN in the TYP condition. In other words, the operating point of VOUTB in the case where VIN is equal to 0.75 V (VDD/2) is 0.59 V.

Therefore, in the case of the buffer circuit 11 according to the conventional technique as shown in FIG. 21, VGSMN1 (=VIN) is equal to 0.590 V, so VGSMN1 is shifted from VIN in the TYP condition by −0.16 V. In contrast, in the case of the semiconductor circuit according to Embodiment 1 of the present invention, VGSMN1 (=VIN) is equal to 0.678 V, so the shift from VIN is reduced to approximately −0.07 V. Thus, the operating point of VOUTB is corrected for compensation.

The case where the type of the process variability on the n-type MOS transistor and the p-type MOS transistor is "small/large" is considered. In this case, as is apparent from the table shown in FIG. 2, βN, βP, VthN, and VthP are 200e-6, 100e-6, 0.5 V, and 0.4 V, respectively. When In1 is calculated based on the transistor sizes (each of LMN1, LMP1, LMN3, and LMP3 is 0.2 μm, WMN1 is 10 μm, WMP1 is 2.9 μm, WMN3 is 3.5 μm, and WMP3 is 16.0 μm) prepared under the TYP condition in the case of VGSMN1=VIN=VDD/2=0.75 V, 0.313 mA is obtained as In1 from Expression (1). Similarly, when Ip1 is calculated using Expression (2) in the case of VGSMP1=VDD=1.5 V, 0.877 mA is obtained as Ip1. When In3 is calculated using Expression (3) in the case of VGSMN3=VDD/2=0.75 V, 0.109 mA is obtained as In3. When Ip3 is calculated using Expression (4) in the case of VGSMP3=VDD/2=0.75 V, 0.490 mA is obtained as Ip3.

As is apparent from FIG. 1, because of circuit coupling in Embodiment 1 of the present invention, a difference current between Ip1 and In1, that is, 0.564 mA (=0.877 mA−0.313 mA) is adjusted by a difference current between Ip3 and In3, that is, 0.381 mA (=0.109 mA−0.490 mA). Therefore, substantial Ip1 is corrected up to 0.496 mA (=0.877 mA−0.381 mA). Thus, when VGSMN1 (=VIN) in the case of In1=Ip1=0.496 mA is calculated using Expression (1), 0.836 V is obtained as VGSMN1 (=VIN).

In order to compare the present invention with the conventional technique, VGSMN1 (=VIN) of the buffer circuit 11 according to the conventional technique as shown in FIG. 21 in the case where the type of the process variability is "small/large" is calculated. In the case of the transistor sizes (each of LMN1 and LMP1 is 0.2 μm, WMN1 is 10 μm, and WMP1 is 2.9 μm), 0.92 V is obtained as VGSMN1 using Expressions (1) and (2). Because VGSMN1 is equal to VIN, VIN in the case where the type of the process variability is "small/large" is increased by 0.17 V from 0.75 V, being VIN in the TYP condition. In other words, the operating point of VOUTB in the case where VIN is equal to 0.75 V (VDD/2) is 0.92 V.

Therefore, in the case of the buffer circuit 11 according to the conventional technique as shown in FIG. 21, VGSMN1 (=VIN) is equal to 0.92 V, so VGSMN1 is shifted from VIN in the TYP condition by +0.17 V. In contrast, in the case of the semiconductor circuit according to Embodiment 1 of the present invention, VGSMN1 (=VIN) is equal to 0.836 V, so the shift from VIN is reduced to approximately +0.086 V. Thus, the operating point of VOUTB is corrected for compensation.

Figure 3A:
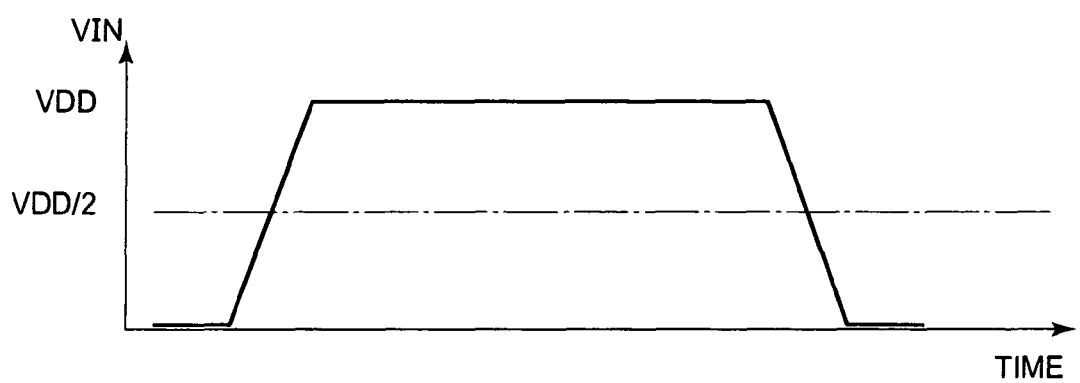
FIGS. 3A and 3B show examples of operating waveforms of the buffer circuit according to Embodiment 1 of the present invention.
Figure 3B:
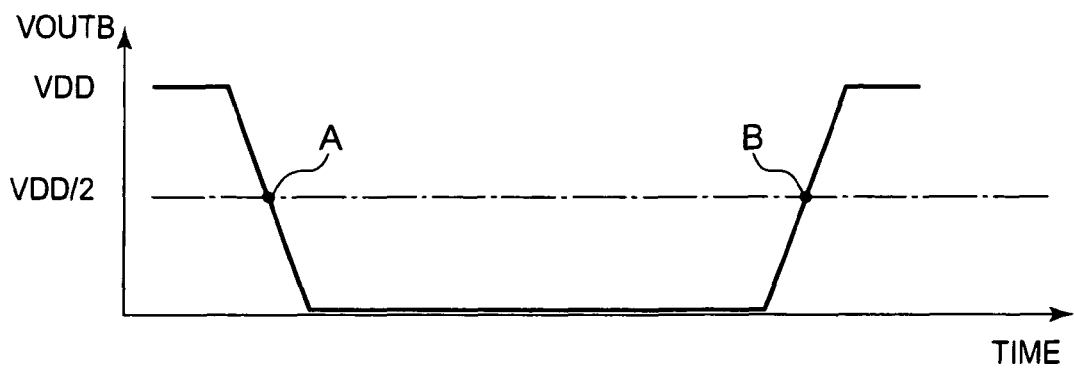

As is apparent from the above description, even when the type of the process variability is "large/small" or "small/large", the operation (change in output to input) waveform of the buffer circuit according to the Embodiment 1 of the present invention is made as shown in FIGS. 3A and 3B. Therefore, substantially the same operation as that of a normal buffer circuit is performed (operating points of the output signal OUTB are points A and B of FIG. 3B).

Figure 4:
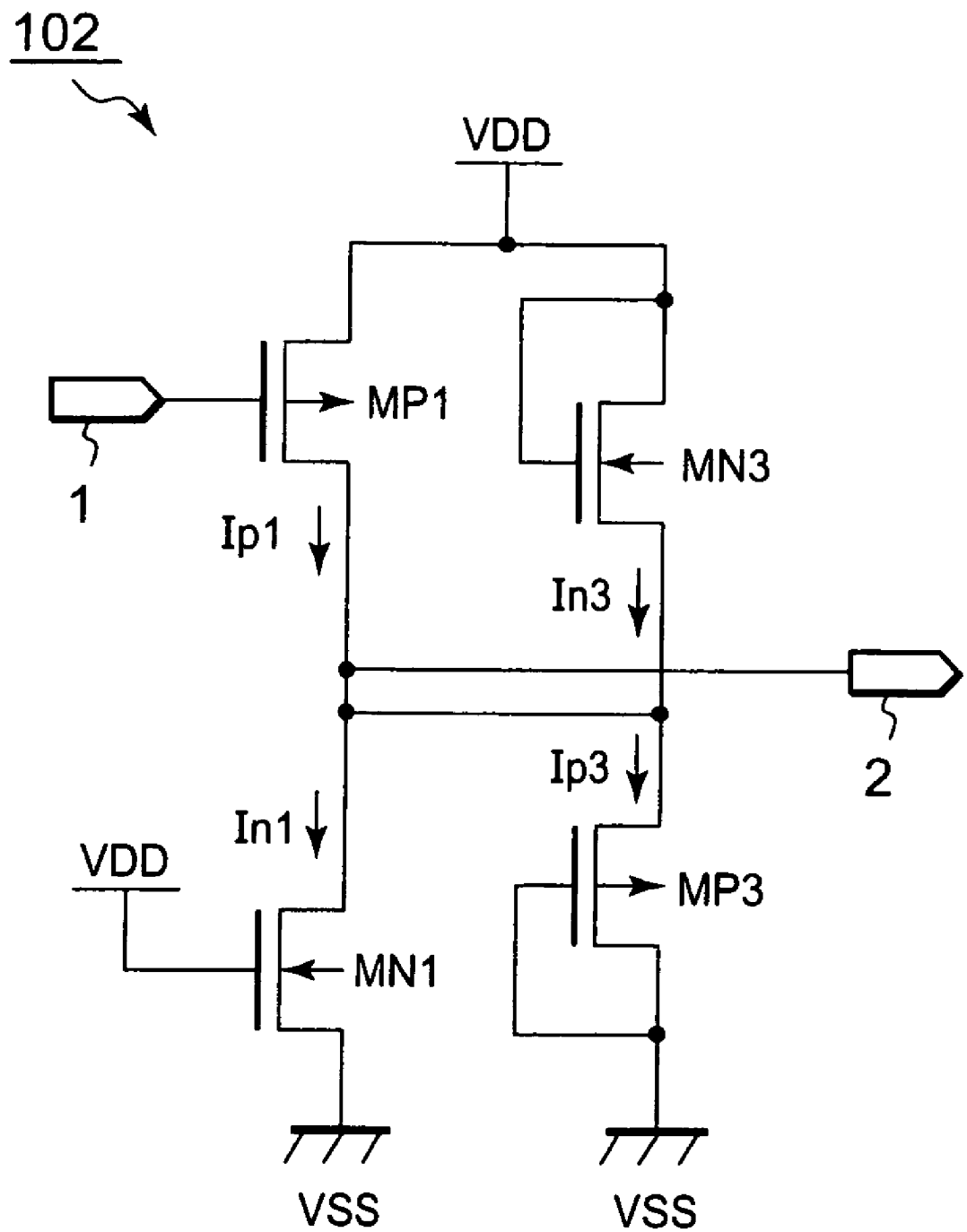
FIG. 4 shows an example of another structure of the buffer circuit according to Embodiment 1 of the present invention.

FIG. 4 shows a buffer circuit 102 in which the input terminal 1 is coupled to the p-type MOS transistor MP1 and the n-type MOS transistor MN1 is coupled to serve as a load for the MOS transistor MP1. In this case, the logic of the output signal OUTB is merely inverted relative to the logic of the output signal of the buffer circuit 101. The other operation and the like are the same, and thus the detailed description is omitted.

As is apparent form the above description, the semiconductor circuit according to Embodiment 1 of the present invention has the following effects. In the case of the buffer circuit 11 according to the conventional technique as shown in FIG. 21, when the condition type of the process variability is varied to "large/small" or "small/large", In1≠Ip1 is obtained under the condition of VIN=VDD/2. Therefore, the operating points of the output signal OUTB deviate. In contrast, in the case of the semiconductor circuit according to Embodiment 1 of the present invention, as shown in FIG. 1, the MOS transistors MP3 and MN3 are provided which are formed by the same manufacturing process as that of the MOS transistors MP1 and MN1 and coupled to power supply voltages reverse to each other. Therefore, the difference between Ip1 and In1 is adjusted by the operating currents In3 and Ip3 of the MOS transistors MN3 and MP3 to correct the operating points of the output signal OUTB for compensation.

Figure 5:
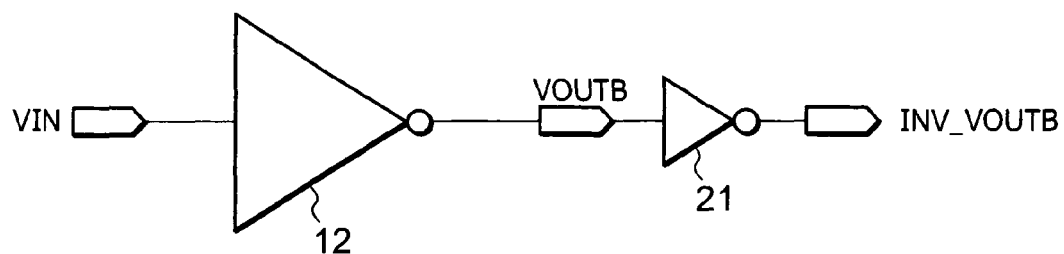
FIG. 5 shows an example of a structure a subsequent-stage circuit of a buffer circuit according to a conventional technique.
Figure 6A:
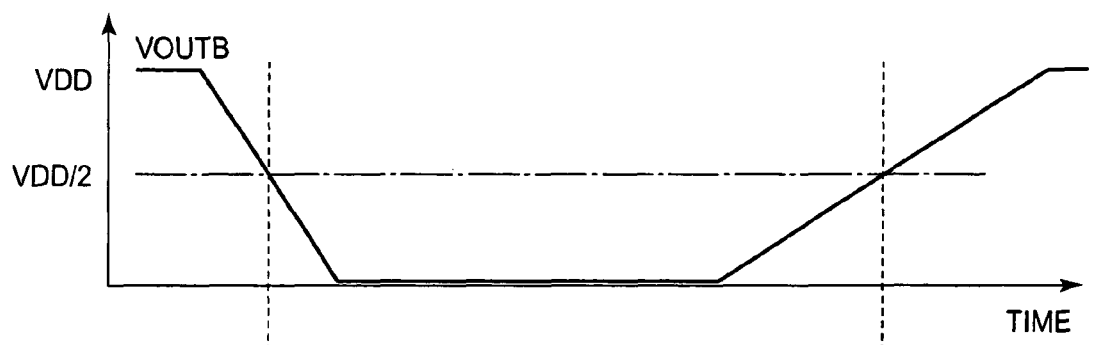
FIGS. 6A and 6B show examples of operating waveforms of the circuit of FIG. 5.
Figure 6B:
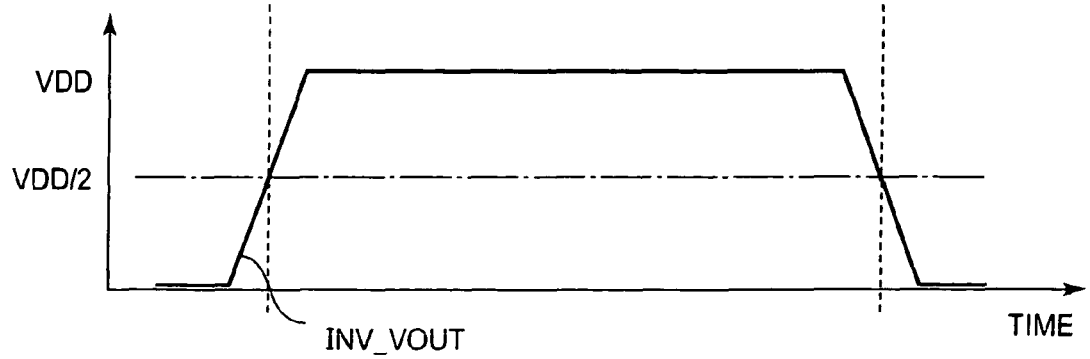

For example, when a normal CMOS inverter 21 (threshold voltage is VDD/2) shown in FIG. 5 receives an output from the buffer circuit 11 according to the conventional technique, a problem occurs in that a predetermined duty value is not obtained as shown in operating waveforms of FIGS. 6A and 6B. (For example, although a duty under the TYP condition is 50%, a duty of each of the waveforms of FIGS. 6A and 6B is equal to or larger than 50%.) When both a rising edge and a falling edge of an output signal of the inverter whose predetermined duty value deviates are to be used for clock signals, a problem occurs in that the margins of setup/hold times are not sufficiently ensured. Therefore, some measures including the addition of a duty correction circuit are required. However, according to the present invention, such a problem can be also solved because the operating points of the output signal OUTB of the buffer circuit 101 can be corrected for compensation.

The semiconductor circuit according to the present invention is expected to be a circuit output stage serving as the buffer circuit. Note that the present invention is not limited to the circuit output stage and thus may be applied to a circuit input stage. This is because, when the semiconductor circuit according to the present invention is used for a preceding stage, there is an advantage that the reliability of a signal for a subsequent-stage circuit is improved.

As in the case of the variability of the manufacturing process, the compensation capability of the semiconductor circuit is effective for a change in threshold voltage of a transistor being caused by a change in operating temperature of the circuit and for a variation in drive capability of the transistor being caused by a change in drain-source voltage due to a variation in power supply voltage. Therefore, variations in operating points which are caused by changes in temperature, power supply voltage, and manufacturing process can be compensated by the semiconductor circuit according to this embodiment. The above description is effective for Embodiment 2 and a subsequent embodiment.

Embodiment 2 of the Present Invention

Hereinafter, a specific example of a semiconductor circuit according to Embodiment 2 of the present invention will be described in detail with reference to the attached drawings. In Embodiment 2, the present invention is applied to a pseudo differential buffer circuit in which two buffer circuits, each of being the buffer circuit according to Embodiment 1, are arranged in parallel.

Figure 7:
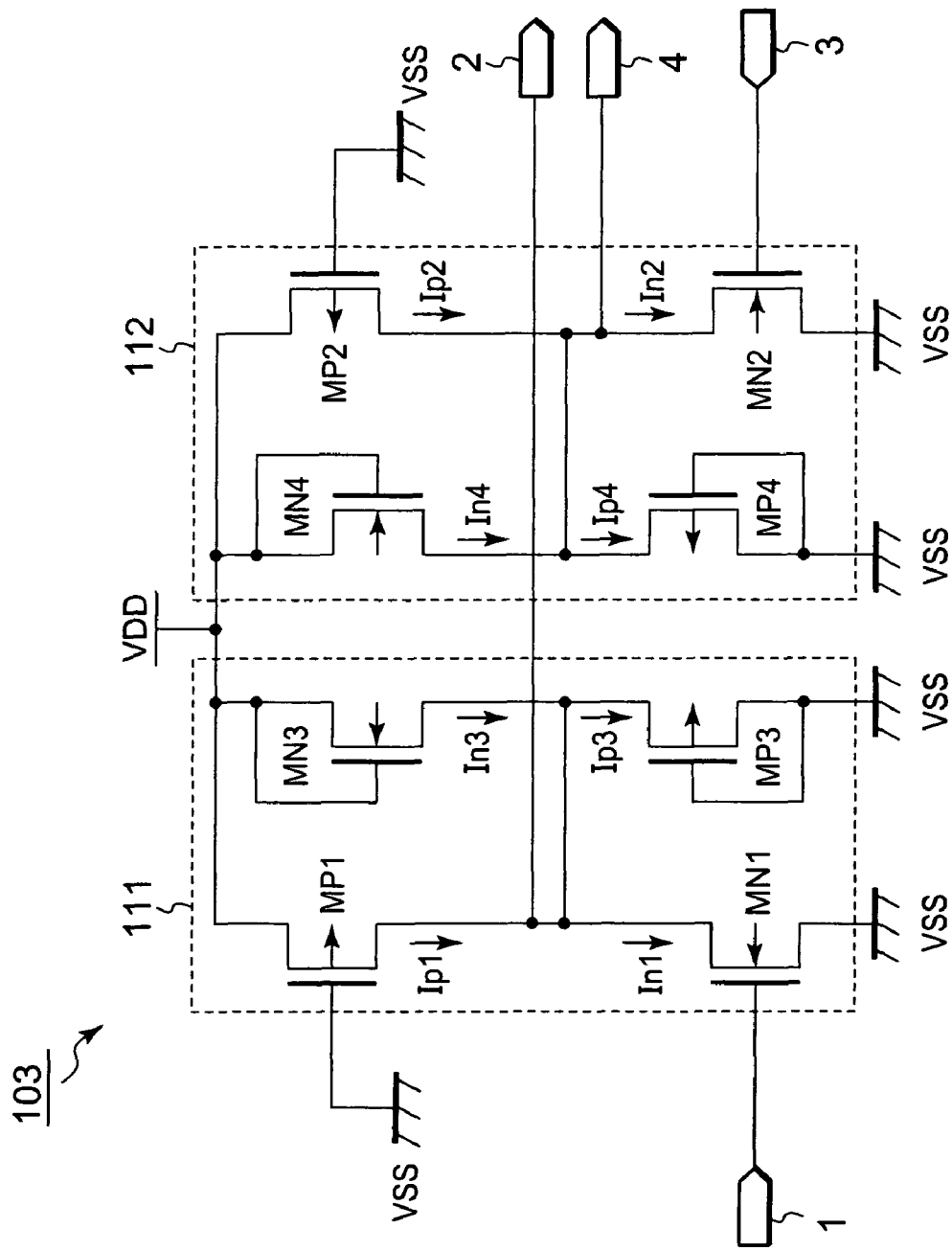
FIG. 7 shows an example of a structure of a pseudo differential buffer circuit according to Embodiment 2 of the present invention.

FIG. 7 shows an example of a structure of the semiconductor circuit according to Embodiment 2 of the present invention. Of reference symbols shown in FIG. 7, elements expressed by the same reference symbols as those shown in FIG. 1 are identical or similar to elements shown in FIG. 1. Embodiment 2 is different from Embodiment 1 in that a circuit structure in which two buffer circuits, each of being the buffer circuit shown in FIG. 1, are coupled in parallel is employed. In this embodiment, the description will be focused on the point.

A pseudo differential buffer circuit 103 includes the input terminal 1 to which the input signal IN is input, the n-type MOS transistor MN1 for generating the inverted logic of the input signal, the p-type MOS transistor MP1 serving as the load for the MOS transistor MN1, the output terminal 2 from which the output signal OUTB being the inverted logic of the input signal is output, and the n-type MOS transistor MN3 and the p-type MOS transistor MP3 which are used to compensate for a variation in rise time of the output signal OUTB (hereinafter, the circuit structure is referred to as circuit unit 111). The pseudo differential buffer circuit 103 further includes an input terminal 3 to which an input signal INB is input, an n-type MOS transistor MN2 for generating a inverted logic of the input signal INB, a p-type MOS transistor MP2 serving as a load for the MOS transistor MN2, an output terminal 4 from which an output signal OUT being the inverted logic of the input signal INB is output, and the n-type MOS transistor MN4 and the p-type MOS transistor MP4 which are used to compensate for a variation in rise time of the output signal OUT (hereinafter, the circuit structure is referred to as circuit unit 112). Note that the input signal IN and the input signal INB are differential signals whose logics are inverted relative to each other. Therefore, the output signal OUTB and the output signal OUT are also signals whose logics are inverted relative to each other.

The MOS transistor MN1 includes the gate coupled to the input terminal 1, the drain coupled to the output terminal 2, and the source coupled to the low-potential side power supply potential VSS. The MOS transistor MP1 includes the gate coupled to the low-potential side power supply potential VSS, the drain coupled to the output terminal 2, and the source coupled to the high-potential side power supply potential VDD. The MOS transistor MN3 includes the source coupled to the output terminal 2, and the drain and the gate which are coupled to the high-potential side power supply potential VDD. The MOS transistor MP3 includes the source coupled to the output terminal 2, and the drain and the gate which are coupled to the low-potential side power supply potential VSS. Assume that a voltage input to the input terminal 1 is expressed by VIN and a voltage output to the output terminal 2 is expressed by VOUTB. The MOS transistor MN2 includes a gate coupled to the input terminal 3, a drain coupled to the output terminal 4, and a source coupled to the low-potential side power supply potential VSS. The MOS transistor MP2 includes a gate coupled to the low-potential side power supply potential VSS, a drain coupled to the output terminal 4, and a source coupled to the high-potential side power supply potential VDD. The MOS transistor MN4 includes a source coupled to the output terminal 4, and a drain and a gate which are coupled to the high-potential side power supply potential VDD. The MOS transistor MP4 includes a source coupled to the output terminal 4, and a drain and a gate which are coupled to the low-potential side power supply potential VSS. Assume that a voltage input to the input terminal 3 is expressed by VINB and a voltage output to the output terminal 4 is expressed by VOUT.

Each of the circuit unit 111 and the circuit unit 112 which are included in the pseudo differential buffer circuit 103 has the same structure as that of the buffer circuit 101 according to Embodiment 1. Therefore, according to the circuit unit 111, the difference between Ip1 and In1 is adjusted by the operating currents In3 and Ip3 of the MOS transistors MN3 and MP3 which are formed by the same manufacturing process as that of the MOS transistors MP1 and MN1 and coupled to power supply voltages reverse to each other, so the operating point deviation can be compensated. According to the circuit unit 112, a difference between Ip2 and In2 is adjusted by operating currents In4 and Ip4 of the MOS transistors MN4 and MP4 which are formed by the same manufacturing process as that of the MOS transistors MP2 and MN2 and coupled to power supply voltages reverse to each other, so the operating point deviation can be compensated.

The above description is the same as that for the buffer circuit 101 according to Embodiment 1 and thus the description using the expressions and the like is omitted.

Figure 8A:
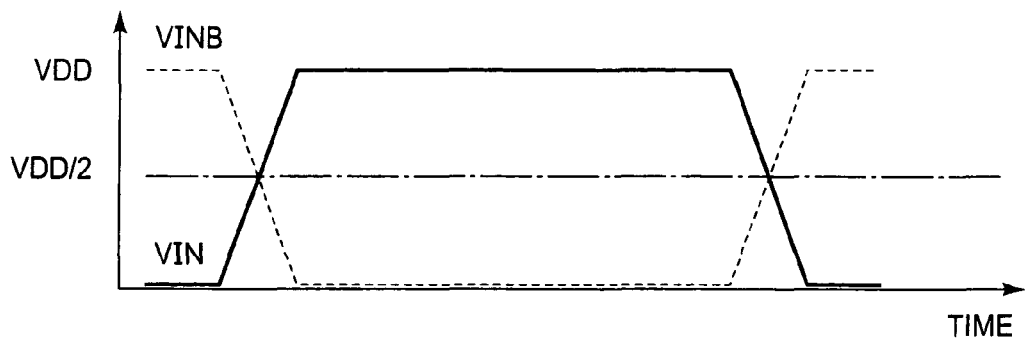
FIGS. 8A and 8B show examples of operating waveforms of the pseudo differential buffer circuit according to Embodiment 2 of the present invention.
Figure 8B:
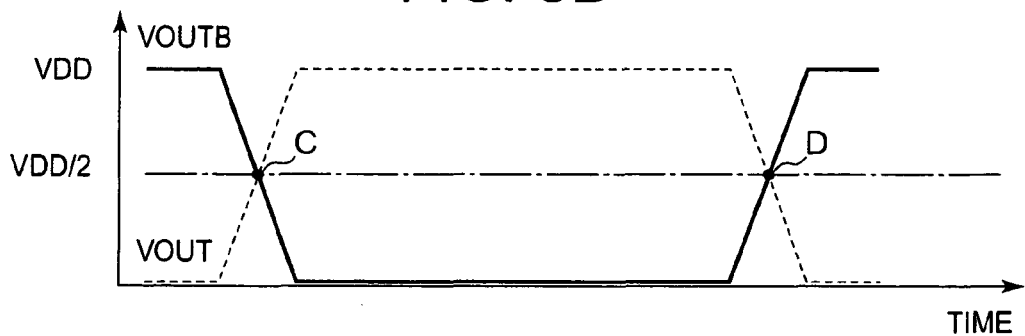

Deviation of points at which the output signals OUT and OUTB cross (cross point) are compensated to obtain operating waveforms shown in FIGS. 8A and 8B. Therefore, even when the process variability occurs, the operating waveforms of the output signals OUT and OUTB in the pseudo differential buffer circuit 103 according to this embodiment are substantially identical to the operating waveforms in the normal pseudo differential buffer circuit (cross points of the output signals OUT and OUTB correspond to points C and D of FIG. 8B).

Figure 9:
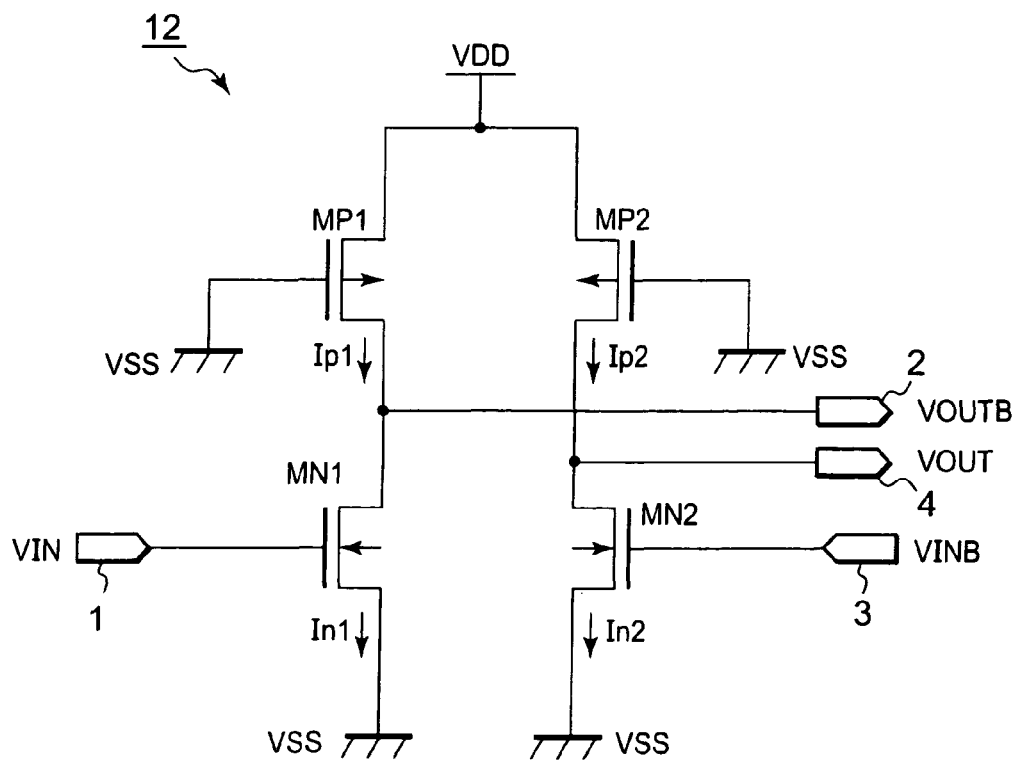
FIG. 9 shows an example of a structure of a pseudo differential buffer circuit according to the conventional technique.

In order to compare the present invention with the conventional technique, a pseudo differential buffer circuit 12 according to the conventional technique is shown in FIG. 9. In the pseudo differential buffer circuit 12, two buffer circuits, each of being the buffer circuit 11 shown in FIG. 21, are coupled in parallel. According to the circuit shown in FIG. 9, the deviations of the operating points of the output signals OUT and OUTB which are caused by the process variability is not compensated. Therefore, the operating points of the output signals OUT and OUTB deviate (cross points deviate). The operating waveforms of the circuit are shown as follows.

Figure 10A:
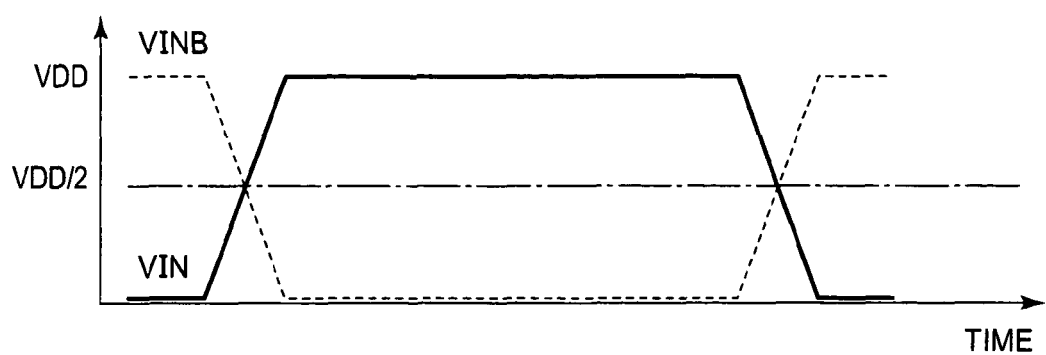
FIGS. 10A and 10B show examples of operating waveforms in the case where process variability on the pseudo differential buffer circuit according to the conventional technique corresponds to a "large/small" condition.
Figure 10B:
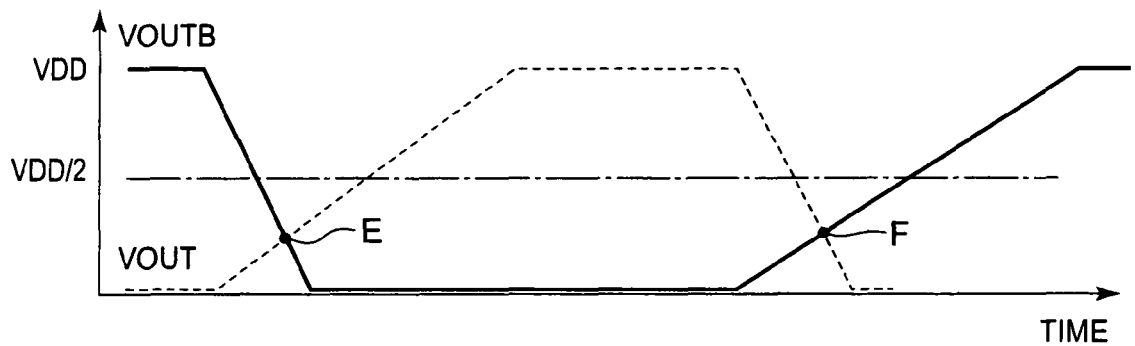
Figure 11A:
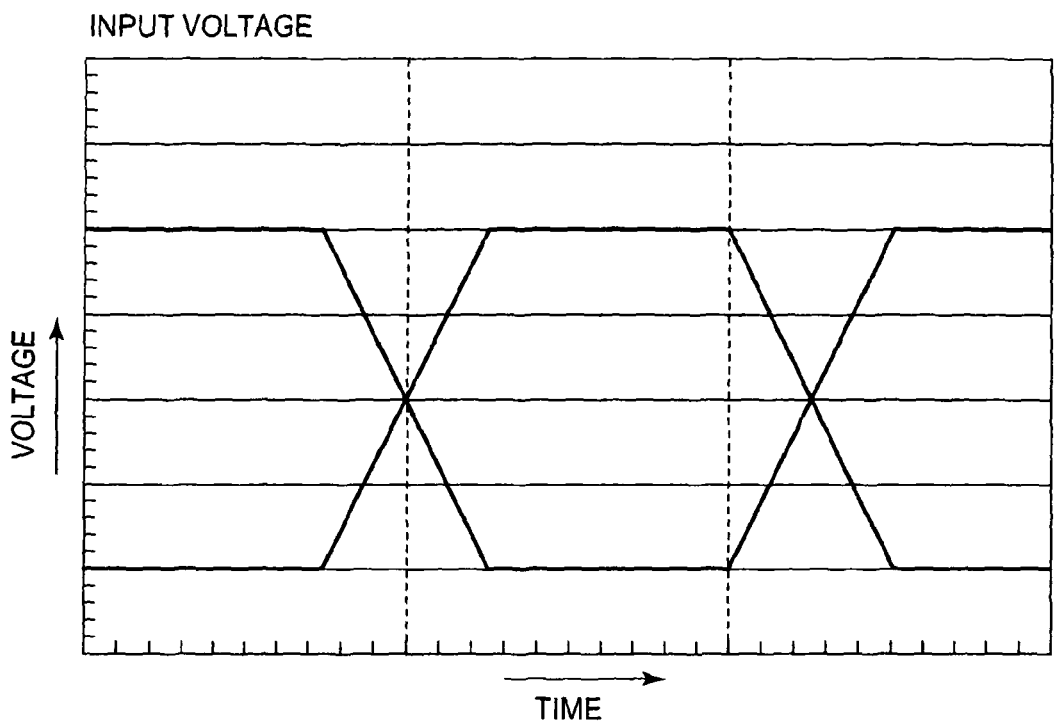
FIGS. 11A and 11B show results obtained by simulation of operating waveforms in the case where process variability on the pseudo differential buffer circuit according to the conventional technique corresponds to the "large/small" condition.
Figure 11B:
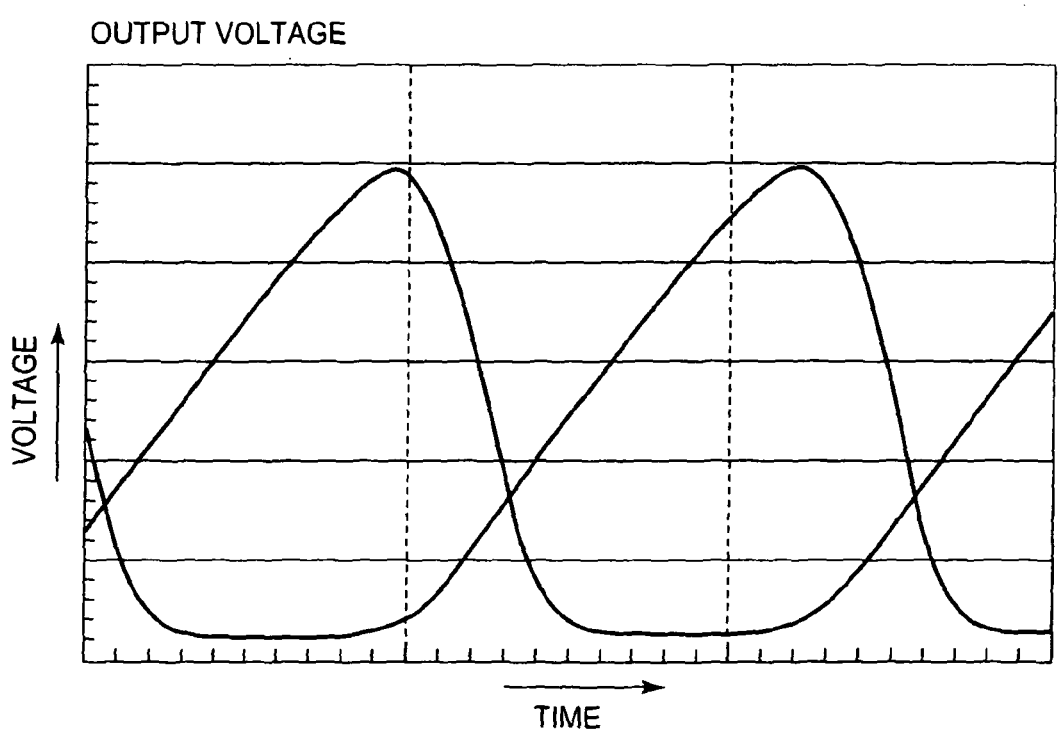

FIGS. 10A and 10B show the operating waveforms in the case where the type of the process variability is "large/small". As shown in FIG. 10B, when each of VIN and VINB is equal to VDD/2, the cross points of VOUT and VOUTB (point-E and point-F in FIG. 10B) fall. Results obtained by waveform simulation on the circuit in the variability condition are shown as reference in FIGS. 11A and 11B. Even in the case of simulation, it is apparent that the same results as those shown in FIGS. 10A and 10B are obtained.

Figure 12A:
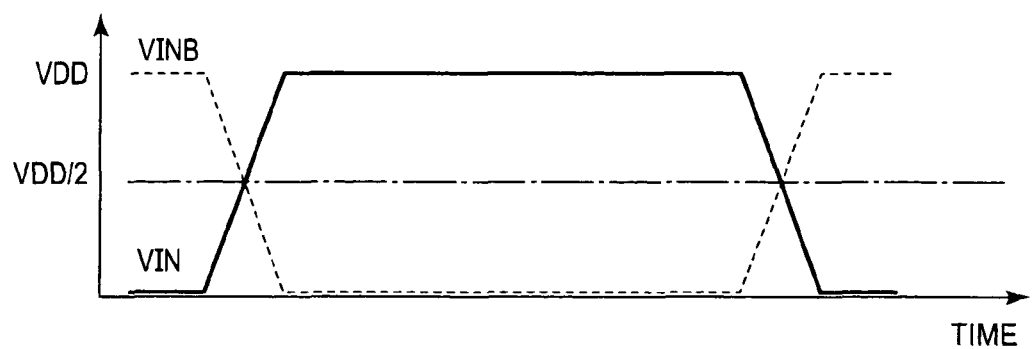
FIGS. 12A and 12B show examples of operating waveforms in the case where process variability on the pseudo differential buffer circuit according to the conventional technique corresponds to a "small/large" condition.
Figure 12B:
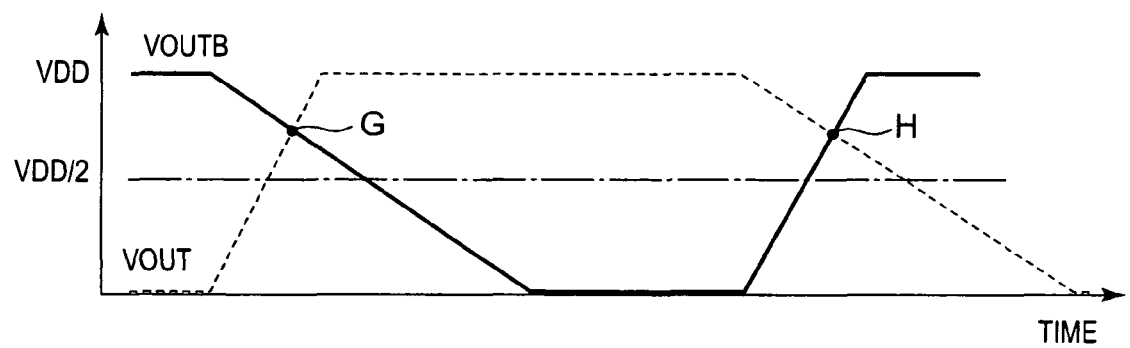

FIGS. 12A and 12B show the operating waveforms in the case where the type of the process variability is "small/large". As shown in FIG. 12B, when each of VIN and VINB is equal to VDD/2, the cross points of VOUT and VOUTB (point-G and point-H in FIG. 12B) rise.

The operation of the pseudo differential buffer circuit 12 according to the conventional technique is described above. According to the pseudo differential buffer circuit 103 in Embodiment 2 of the present invention, the operating waveforms as shown in FIGS. 8A and 8B are obtained, so the variations in cross points as shown in FIG. 10B (or FIG. 12B) can be suppressed.

Figure 13:
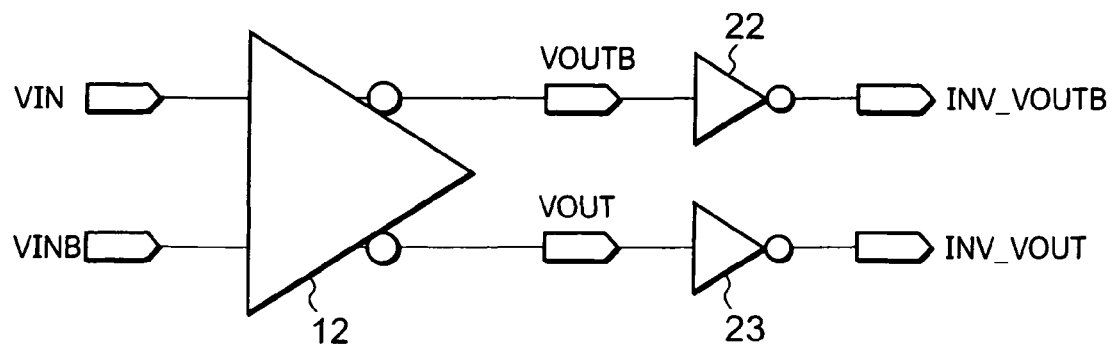
FIG. 13 shows an example of a structure of a subsequent circuit of the pseudo differential circuit according to the conventional technique as shown in FIG. 9.

For example, when normal CMOS inverters 22 and 23 (threshold voltage is VDD/2) shown in FIG. 13 receives an output from the buffer circuit 12 according to the conventional technique, a problem occurs in that a predetermined duty value is not obtained as shown in operating waveforms of FIGS. 14A and 14B. (For example, although a duty in the TYP condition is 50%, a duty of each of the waveforms of FIGS. 14A and 14B is equal to or larger than 50%.) When both a rising edge and a falling edge of an output signal of each inverter whose predetermined duty value deviates are to be used for clock signals, a problem occurs in that the margins of setup/hold times are not sufficiently ensured. Therefore, some measures including the addition of a duty correction circuit are required. However, according to the present invention, such a problem can be also solved because the cross points of the output signals OUTB and OUT of the buffer circuit 103 can be corrected for compensation.

As in the case of Embodiment 1 of the present invention, the compensation capability of the semiconductor circuit according to this embodiment is effective for a change in threshold voltage of a transistor being caused by a change in operating temperature of the circuit and for a variation in drive capability of the transistor being caused by a change in drain-source voltage due to a variation in power supply voltage or the like, as in the case of the variability of the manufacturing process. Therefore, variations in positive and negative cross points which are caused by changes in temperature, power supply voltage, and manufacturing process can be compensated by the semiconductor circuit according to this embodiment.

Figure 15:
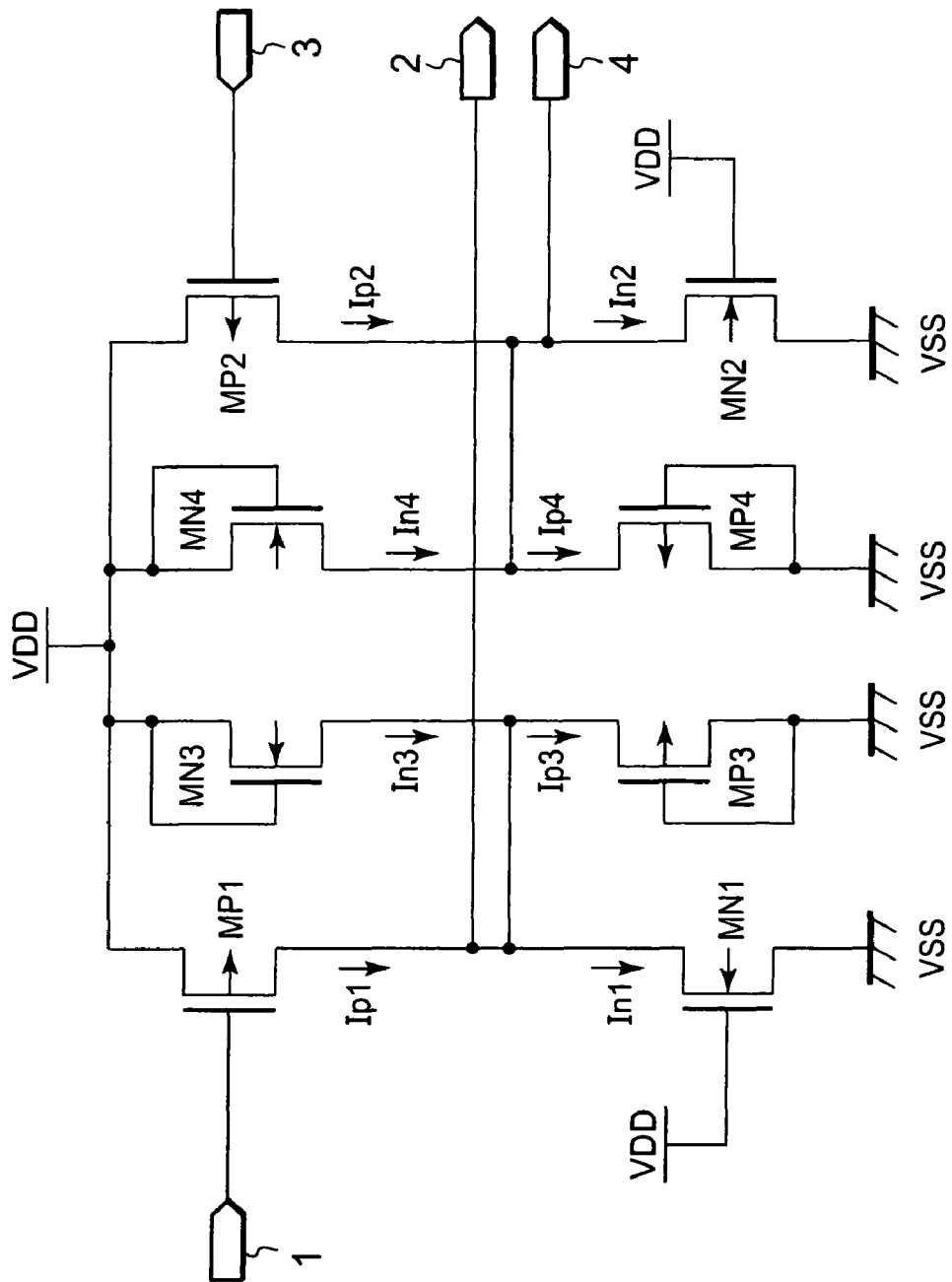
FIG. 15 shows an example of another structure of the pseudo differential buffer circuit according to Embodiment 2 of the present invention.

FIG. 15 shows a pseudo differential buffer circuit 104. In the pseudo differential buffer circuit 104, the input terminal 1 is coupled to the p-type MOS transistor MP1, the n-type MOS transistor MN1 is coupled to serve as the load for the MOS transistor MP1, the input terminal 3 is coupled to the p-type MOS transistor MP2, and the n-type MOS transistor MN2 is coupled to serve as the load for the MOS transistor MP2. Note that other structures are identical to the structures as shown in FIG. 7. In this case, the logic of each of the output signals OUTB and OUT is inverted relative to the logic of corresponding one of the output signals of the pseudo differential buffer circuit 103 shown in FIG. 7. The operation and the effect are the same as described above and thus the detailed description thereof will be omitted.

Embodiment 3 of the Present Invention

Hereinafter, a specific example of a semiconductor circuit according to Embodiment 3 of the present invention will be described in detail with reference to the attached drawings. In Embodiment 3, the present invention is applied to a buffer circuit or a pseudo differential buffer circuit as in the case of Embodiment 1 or 2 of the present invention.

Figure 16:
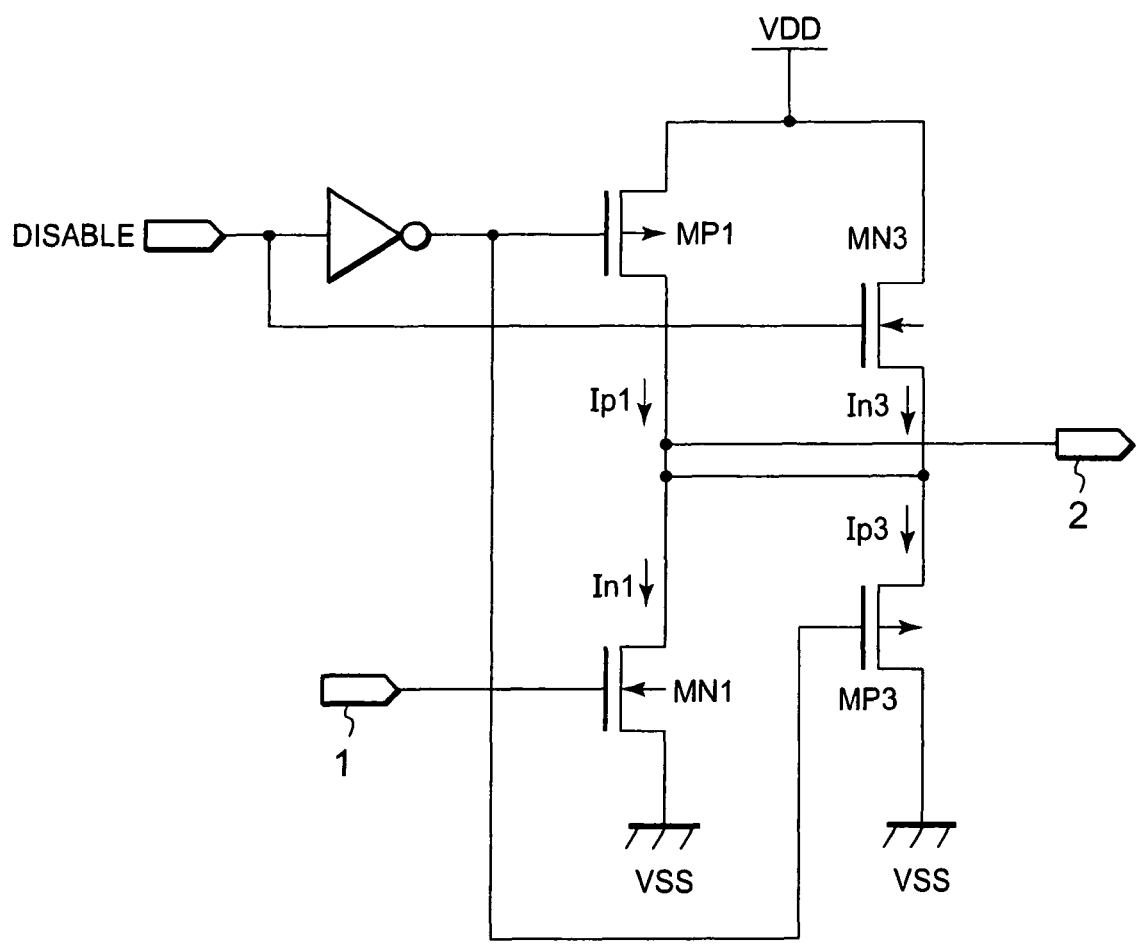
FIG. 16 shows an example of a structure of a pseudo differential buffer circuit according to Embodiment 3 of the present invention.
Figure 17:
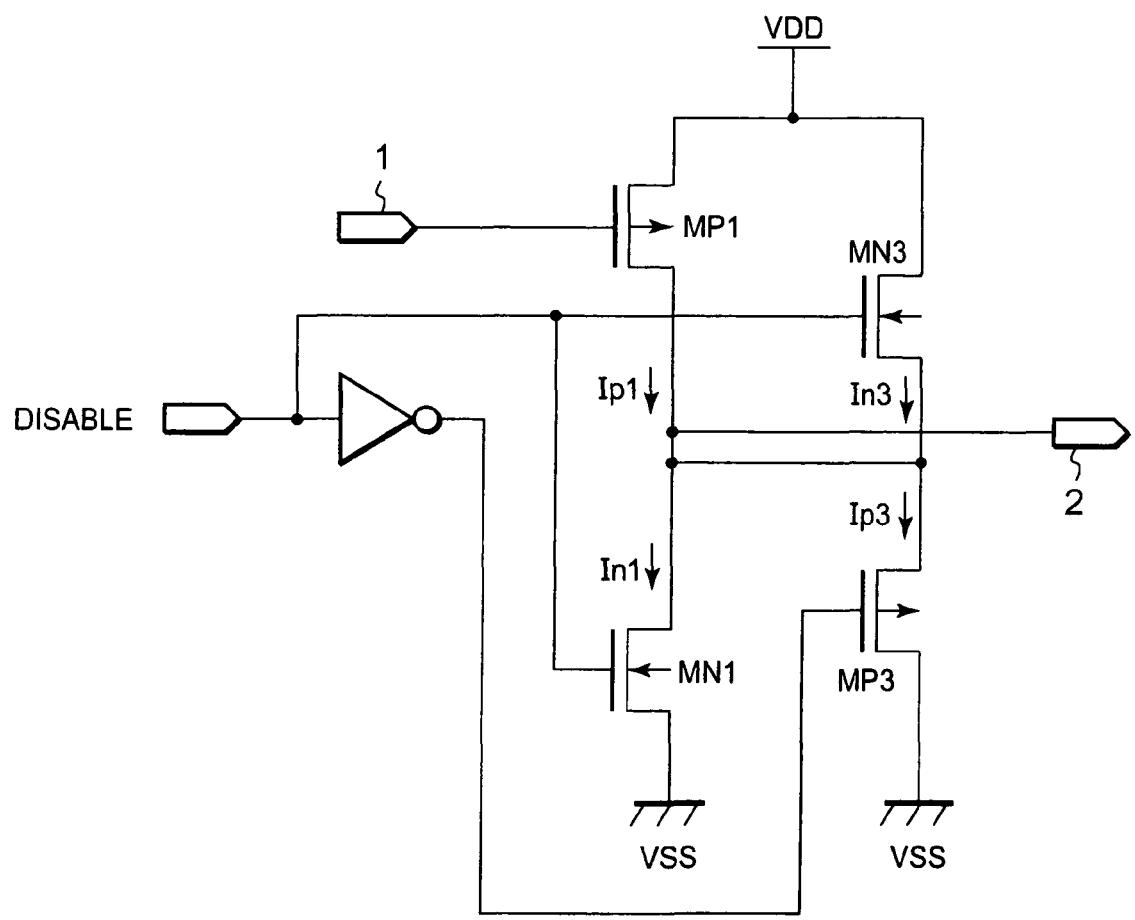
FIG. 17 shows an example of another structure of the pseudo differential buffer circuit according to Embodiment 3 of the present invention.
Figure 18:
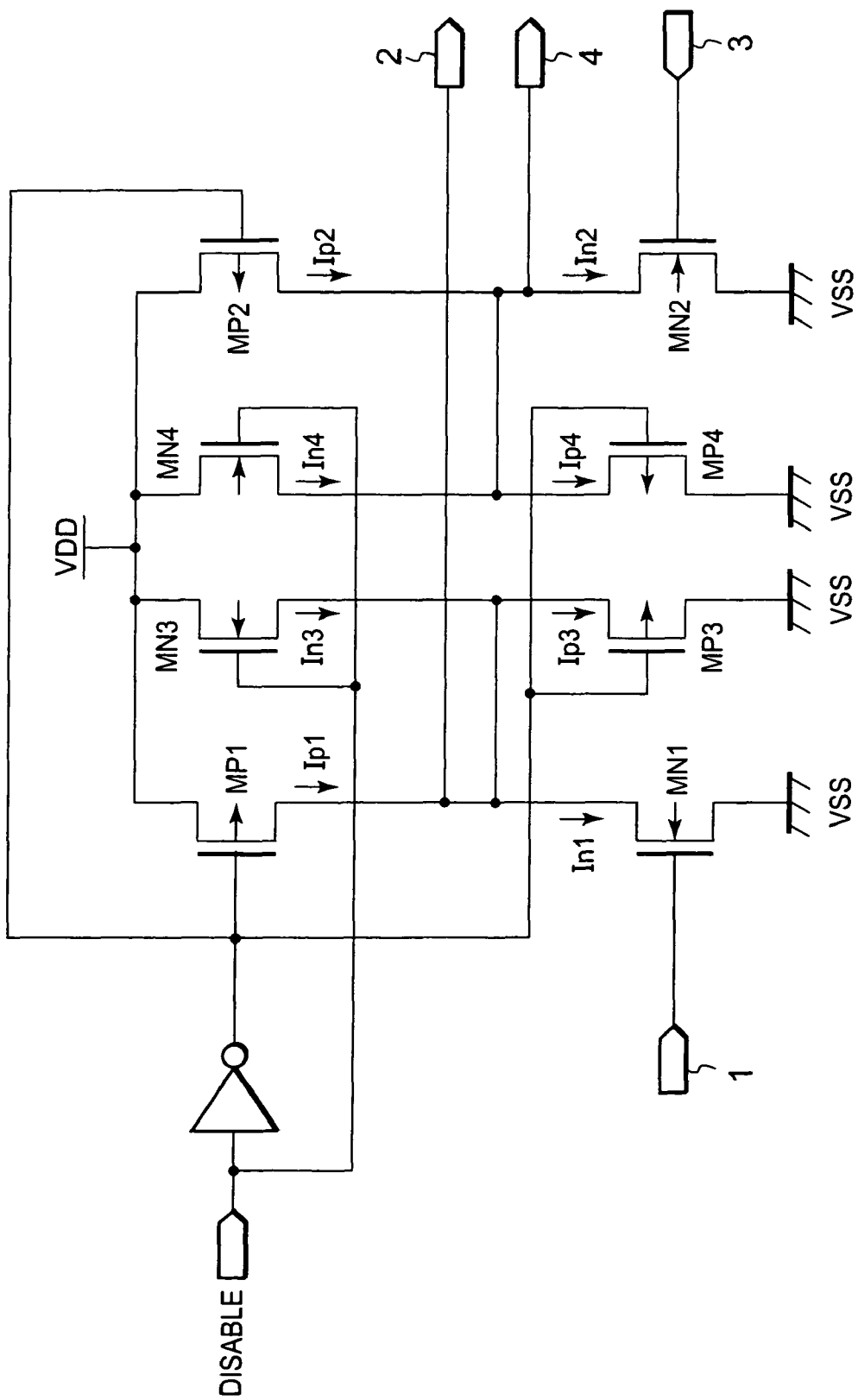
FIG. 18 shows an example of another structure of the pseudo differential buffer circuit according to Embodiment 3 of the present invention.
Figure 19:
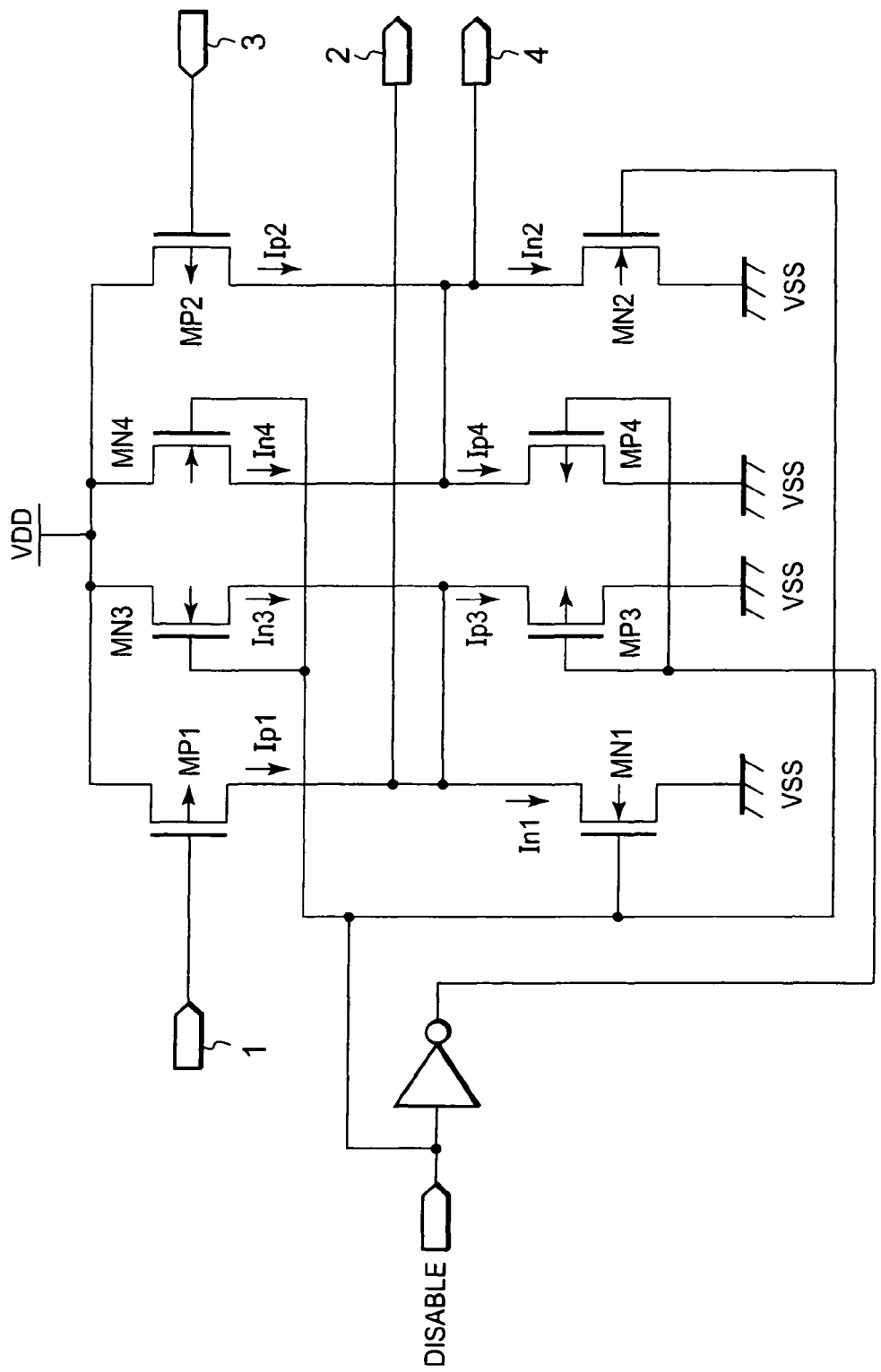
FIG. 19 shows an example of another structure of the pseudo differential buffer circuit according to Embodiment 3 of the present invention.

FIG. 16 shows an example of a structure of the semiconductor circuit according to Embodiment 3 of the present invention. In the semiconductor circuit according to this embodiment as shown in FIG. 16, a disable signal (DISABLE) is input to the gate of the MOS transistor MN3 of the buffer circuit 101 of FIG. 1 as described in Embodiment 1 of the present invention. An inverted signal of the disable signal is input to the gate of each of the MOS transistors MP1 and MP3 through an inverter. Here, it is assumed that the disable signal to be input is "1" in the case where the circuit is in an active state and "0" in the case where the circuit is in a non-active state. Thus, in this case, when the disable signal is "1", the same operation as Embodiment 1 of the present invention is performed. When the disable signal is "0", the gate of each of the MOS transistors MP1, MN3, and MP3 is closed, so the buffer circuit 101 becomes the non-active state. Therefore, when a circuit non-active signal for a normal circuit, such as the disable signal is used, the buffer circuit according to Embodiment 1 of the present invention can be reduced in power. FIG. 17 shows a circuit in which the disable signal as described above is applied to the buffer circuit 102 of FIG. 4 according to Embodiment 4 of the present invention. FIGS. 18 and 19 show a circuit in which the disable signal as described above is applied to the pseudo differential buffer circuit 103 shown in FIG. 7 and a circuit in which the disable signal is applied to the pseudo differential buffer circuit 104 shown in FIG. 15. According to the pseudo differential buffer circuits, the same power reduction effect as described above can be obtained.

Figure 20:
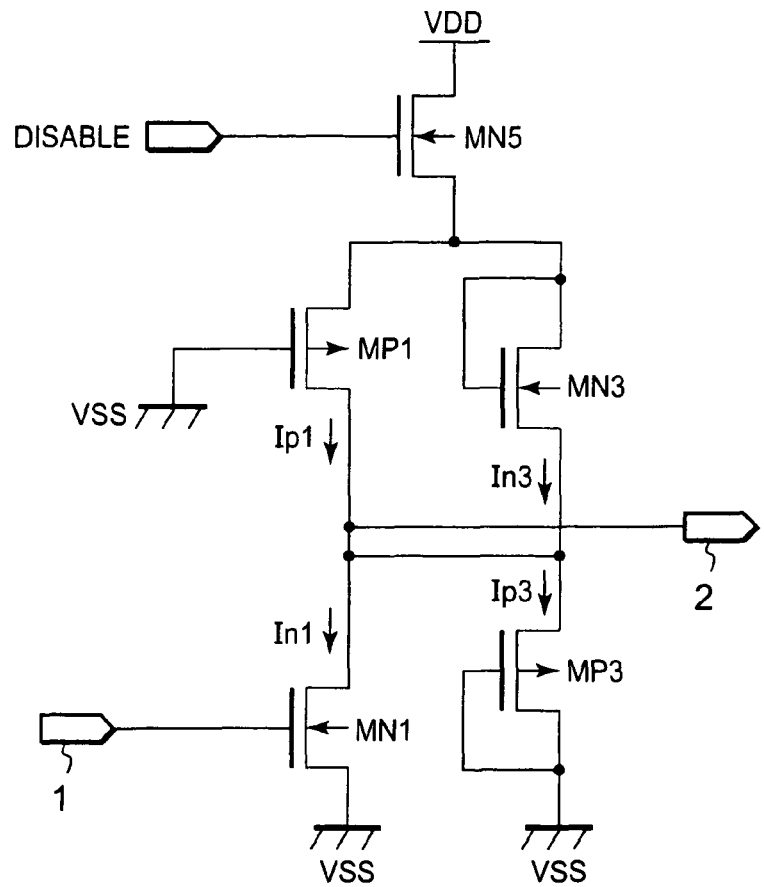
FIG. 20 shows an example of a structure of a pseudo differential buffer circuit according to another embodiment of the present invention.

The present invention is not limited to the embodiments described above and thus appropriate modifications can be made without departing from the scope of the present invention. For example, as shown in FIG. 20, an n-type MOS transistor MN5 may be coupled to the high-potential side power supply potential VDD (or low-potential side power supply potential VSS) of the circuit shown in FIG. 1. Thus, as in the case of Embodiment 3 of the present invention, the disable signal can be used to reduce the power of the circuit.

What is claimed is:

1. A semiconductor circuit comprising:
   an output buffer configured to allow a first current to flow to a node, wherein the buffer comprises:
   a first plurality of cascode-coupled transistors with said node therebetween, configured to allow the first current comprising a difference current between the first plurality of transistors to leak at said node in response to process variability in transistor characteristics at an operating point; and
   a compensating circuit configured to enable a second current to flow to the node, said second current compensating for the first current,
   wherein the compensating circuit comprises a second plurality of cascode-coupled transistors with said node therebetween, generating the second current comprising a difference current between the second plurality of transistors in response to product variability in transistor characteristics at the operating point, wherein:
   the buffer comprises a CMOS circuitry; and
   the second plurality of transistors comprises:
   a p-MOS transistor comprising a control electrode coupled to a first voltage, a first current conducting electrode coupled to the node, and a second current conducting electrode coupled to the first voltage; and
   an n-MOS transistor comprising a control electrode coupled to a second voltage, a first current conducting electrode coupled to the node, and a second current conducting electrode coupled to the second voltage.

2. The semiconductor circuit according to claim 1, wherein the second plurality of transistors are provided being simultaneously formed by the same manufacturing process as that of the first plurality of transistors.

3. The semiconductor circuit according to claim 2, wherein a product variability of the second plurality of transistors corresponds to a product variability of the first plurality of transistors.

4. A semiconductor circuit comprising:
   an output buffer configured to allow a first current to flow to a node, wherein the buffer comprises:
   a first plurality of cascode-coupled transistors with said node therebetween, configured to allow the first current comprising a difference current between the first plurality of transistors to leak at said node in response to process variability in transistor characteristics at an operating point; and
   a compensating circuit configured to enable a second current to flow to the node, said second current compensating for the first current,
   wherein the compensating circuit comprises a second plurality of cascode-coupled transistors with said node therebetween, generating the second current comprising a difference current between the second plurality of transistors in response to product variability in transistor characteristics at the operating point,
   wherein said first plurality of transistors comprises:
   a first transistor of a first conduction type coupled between the node and a first voltage to conduct a current in response to an input signal; and
   a second transistor of a second conduction type coupled between the node and a second voltage to flow a current in a normally-ON state, and
   said second plurality of transistors comprises:
   a third transistor of the second conduction type coupled between the node and the first voltage to flow a current in a normally-ON state; and
   a fourth transistor of the first conduction type coupled between the node and the second voltage to flow a current in a normally-ON state.

5. The semiconductor circuit according claim 4, wherein the third and the fourth transistors are simultaneously formed by a same manufacturing process as that of the first and the second transistors.

6. The semiconductor circuit according claim 5, wherein a product variability of the third and the fourth transistors corresponds to a product variability of the first and the second transistors.

7. The semiconductor circuit according to claim 6, wherein:
   a transistor capability of the third transistor substantially corresponds to a transistor capability of the first transistor, and
   a transistor capability of the fourth transistor substantially corresponds to a transistor capability of the second transistor.

8. The semiconductor circuit according to claim 7, wherein said transistor capabilities are determined for each transistor according to a gate width, a gate length, a carrier mobility, a gate oxide film capacitance, a gate-source voltage, and a threshold voltage of said each transistor.

9. The semiconductor circuit according to claim 7, wherein transistor capabilities of said first and second transistors are selected such that a current flowing through said first transistor is equal to a current flowing through said second transistor when said input signal and an output signal at said node are each equal to half of a voltage difference between said first and second voltages.

10. The semiconductor circuit according to claim 9, wherein transistor capabilities of said first and second transistors are described by equations $$In1=(\beta N/2)*(WMN1/LMN1)*(VGSMN1-VthN)^2$$

and $$Ip1=(\beta P/2)*(WMP1/LMP1)*(VGSMP1-VthP)^2,$$

where In1 comprises said current flowing through said first transistor,
Ip1 comprises said current flowing through said second transistor,
WMN1 comprises a gate width of said first transistor,
WMP1 comprises a gate width of said second transistor,
LMN1 comprises a gate length of said first transistor,
LMP1 comprises a gate length of said second transistor,
βN comprises a product of a carrier mobility and a gate oxide film capacitance in said first transistor,
βP comprises a product of a carrier mobility and a gate oxide film capacitance in said second transistor,
VGSMN1 comprises a gate-source voltage of said first transistor,
VGSMP1 comprises a gate-source voltage of said second transistor,
VthN comprises a threshold voltage of said first transistor, and
VthP comprises a threshold voltage of said second transistor.

11. The semiconductor circuit according to claim 9, wherein transistor capabilities of said third and fourth transistors are selected such that a current flowing through said third transistor is equal to a current flowing through said fourth transistor when said input signal and said output signal at said node are each equal to half of a voltage difference between said first and second voltages.

12. The semiconductor circuit according to claim 11, wherein transistor capabilities of said third and fourth transistors are described by equations $$In3=(\beta N/2)*(WMN3/LMN3)*(VGSMN3-VthN)^2$$

and $$Ip3=(\beta P/2)*(WMP3/LMP3)*(VGSMP3-VthP)^2,$$

where In3 comprises said current flowing through said fourth transistor,
Ip3 comprises said current flowing through said third transistor,
WMN3 comprises a gate width of said fourth transistor,
WMP3 comprises a gate width of said third transistor,
LMN3 comprises a gate length of said fourth transistor,
LMP3 comprises a gate length of said third transistor,
VGSMN3 comprises a gate-source voltage of said fourth transistor, and
VGSMP3 comprises a gate-source voltage of said third transistor.

13. The semiconductor circuit according to claim 4, wherein said couple of said fourth transistor between said second voltage and said node comprises a disable signal input to a gate of said fourth transistor,
said couple of said second transistor between said second voltage and said node comprises an inversion of said disable signal input to a gate of said second transistor, and
said couple of said third transistor between said first voltage and said node comprises said inversion of said disable signal input to a gate of said third transistor.

14. A semiconductor circuit comprising:
an output buffer configured to allow a first current to flow to a node, wherein the buffer comprises:
a first plurality of cascode-coupled transistors with said node therebetween, configured to allow the first current comprising a difference current between the first plurality of transistors to leak at said node in response to process variability in transistor characteristics at an operating point; and
a compensating circuit configured to enable a second current to flow to the node, said second current compensating for the first current,
wherein the compensating circuit comprises a second plurality of cascode-coupled transistors with said node therebetween, generating the second current comprising a difference current between the second plurality of transistors in response to product variability in transistor characteristics at the operating point, wherein
said first plurality of transistors comprises:
a first transistor of a first conduction type comprising a current-conducting electrode coupled to the node to conduct a current in response to an input signal;
a second transistor of a second conduction type comprising a current-conducting electrode coupled to the node as a load to said first transistor, and
said second plurality of transistors comprises:
a third transistor of the second conduction type including a control electrode coupled to a first voltage, a first current conducting electrode coupled to the node, and a second current conducting electrode coupled to the first voltage; and
a fourth transistor of the first conduction type having a control electrode coupled to a second voltage, a first current conducting electrode coupled to the node, and a second current conducting electrode coupled to the second voltage.

15. The semiconductor circuit according to claim 14, wherein the third and the fourth transistors are simultaneously formed by a same manufacturing process as that of the first and the second transistors.

16. The semiconductor circuit according to claim 15, wherein a product variability of the third and the fourth transistors corresponds to a product variability of the first and the second transistors.

17. The semiconductor circuit according to claim 16, wherein:
a transistor capability of the third transistor substantially corresponds to a transistor capability of the first transistor, and
a transistor capability of the fourth transistor substantially corresponds to a transistor capability of the second transistor.

18. The semiconductor circuit according to claim 17, wherein said transistor capabilities are determined for each transistor according to a gate width, a gate length, a carrier mobility, a gate oxide film capacitance, a gate-source voltage, and a threshold voltage of said each transistor.

19. The semiconductor circuit according to claim 17, wherein transistor capabilities of said first and second transistors are selected such that a current flowing through said first transistor is equal to a current flowing through said second transistor when said input signal and an output signal at said node are each equal to half of a voltage difference between said first and second voltages.

20. The semiconductor circuit according to claim 19, wherein transistor capabilities of said first and second transistors are described by equations $$In1=(\beta N/2)*(WMN1/LMN1)*(VGSMN1-VthN)^2$$

and $$Ip1=(\beta P/2)*(WMP1/LMP1)*(VGSMP1-VthP)^2,$$

where In1 comprises said current flowing through said first transistor,
Ip1 comprises said current flowing through said second transistor,
WMN1 comprises a gate width of said first transistor,
WMP1 comprises a gate width of said second transistor,
LMN1 comprises a gate length of said first transistor,
LMP1 comprises a gate length of said second transistor,
βN comprises a product of a carrier mobility and a gate oxide film capacitance in said first transistor,
βP comprises a product of a carrier mobility and a gate oxide film capacitance in said second transistor,
VGSMN1 comprises a gate-source voltage of said first transistor,
VGSMP1 comprises a gate-source voltage of said second transistor,
VthN comprises a threshold voltage of said first transistor, and
VthP comprises a threshold voltage of said second transistor.

21. The semiconductor circuit according to claim 19, wherein transistor capabilities of said third and fourth transistors are selected such that a current flowing through said third transistor is equal to a current flowing through said fourth transistor when said input signal and said output signal at said node are each equal to half of a voltage difference between said first and second voltages.

22. The semiconductor circuit according to claim 21, wherein transistor capabilities of said third and fourth transistors are described by equations $$In3=(\beta N/2)*(WMN3/LMN3)*(VGSMN3-VthN)^2$$

and $$Ip3=(\beta P/2)*(WMP3/LMP3)*(VGSMP3-VthP)^2,$$

where In3 comprises said current flowing through said fourth transistor,
Ip3 comprises said current flowing through said third transistor,
WMN3 comprises a gate width of said fourth transistor,
WMP3 comprises a gate width of said third transistor,
LMN3 comprises a gate length of said fourth transistor,
LMP3 comprises a gate length of said third transistor,
VGSMN3 comprises a gate-source voltage of said fourth transistor, and
VGSMP3 comprises a gate-source voltage of said third transistor.

23. The semiconductor circuit according to claim 14, further comprising a disable signal, wherein
said disable signal is input to a gate of said second transistor and to a gate of said third transistor, and
an inversion of said disable signal is input to a gate of said fourth transistor.

24. A pseudo differential buffer circuit comprising two semiconductor circuits each according to claim 1, said two semiconductor circuits being arranged in parallel with each other.

25. A pseudo differential buffer circuit comprising two semiconductor circuits each according to claim 4, said two semiconductor circuits being arranged in parallel with each other.

26. A pseudo differential buffer circuit comprising two semiconductor circuits each according to claim 14, said two semiconductor circuits being arranged in parallel with each other.

* * * * *